US009777379B2

(12) United States Patent
Inatomi et al.

(10) Patent No.: US 9,777,379 B2
(45) Date of Patent: Oct. 3, 2017

(54) PLATING APPARATUS, PLATING METHOD AND STORAGE MEDIUM

(75) Inventors: Yuichiro Inatomi, Nirasaki (JP); Takashi Tanaka, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 420 days.

(21) Appl. No.: 14/129,698

(22) PCT Filed: Jun. 4, 2012

(86) PCT No.: PCT/JP2012/064381
§ 371 (c)(1),
(2), (4) Date: Dec. 27, 2013

(87) PCT Pub. No.: WO2013/001986
PCT Pub. Date: Jan. 3, 2013

(65) Prior Publication Data
US 2015/0232994 A1    Aug. 20, 2015

(30) Foreign Application Priority Data

Jun. 29, 2011 (JP) ................................. 2011-144800

(51) Int. Cl.
*B05D 3/10* (2006.01)
*C23C 18/16* (2006.01)
*C23C 18/18* (2006.01)

(52) U.S. Cl.
CPC ........ *C23C 18/163* (2013.01); *C23C 18/1632* (2013.01); *C23C 18/1655* (2013.01); *C23C 18/1676* (2013.01); *C23C 18/18* (2013.01)

(58) Field of Classification Search
CPC ............ C23C 18/1633; C23C 18/1655; C23C 18/1675; C23C 18/1676
See application file for complete search history.

(56) References Cited

U.S. PATENT DOCUMENTS

| 2003/0019426 A1* | 1/2003 | Inoue .................. C23C 18/1619 |
| | | 118/429 |
| 2003/0118732 A1* | 6/2003 | Stevens ............... C23C 18/1632 |
| | | 427/346 |
| 2009/0253258 A1* | 10/2009 | Hara .................... C23C 18/1628 |
| | | 438/597 |

FOREIGN PATENT DOCUMENTS

| JP | 2005-200701 A | | 7/2005 |
| JP | 2005200701 A | * | 7/2005 |
| JP | 2009-249679 A | | 10/2009 |

OTHER PUBLICATIONS

International Search Report for PCT/JP2012/064381 dated Jun. 26, 2012.

* cited by examiner

*Primary Examiner* — Dah-Wei D Yuan
*Assistant Examiner* — Nga Leung V Law
(74) *Attorney, Agent, or Firm* — Pearne & Gordon LLP

(57) ABSTRACT

A plating apparatus can perform a plating process on an entire surface of a substrate uniformly. A plating apparatus 20 includes a substrate holding/rotating device 110 configured to hold and rotate a substrate 2; a discharging device 21 configured to discharge a plating liquid toward the substrate 2 held on the substrate holding/rotating device 110; and a controller 160 configured to control the substrate holding/rotating device 110 and the discharging device 21. Further, the discharging device 21 includes a first nozzle 40 having a multiple number of discharge openings 41 arranged in a radial direction of the substrate 2 or having a discharge opening 42 extended in the radial direction of the substrate 2; and a second nozzle 45 having a discharge opening 46 configured to be positioned closer to a central portion of the substrate 2 than the discharge opening of the first nozzle 40.

4 Claims, 11 Drawing Sheets

PLATING APPARATUS, PLATING METHOD AND STORAGE MEDIUM

CROSS-REFERENCE TO RELATED APPLICATION

This Application is a U.S. national phase application under 35 U.S.C. §371 of PCT Application No. PCT/JP2012/064381 filed on Jun. 4, 2012, which claims the benefit of Japanese Patent Application No. 2011-144800 filed on Jun. 29, 2011, the entire disclosures of which are incorporated herein by reference.

TECHNICAL FIELD

The embodiments described herein pertain generally to a plating apparatus, a plating method and a storage medium for performing a plating process by supplying a plating liquid onto a surface of a substrate.

BACKGROUND ART

Recently, a wiring is formed on a substrate such as a semiconductor wafer or a liquid crystal substrate to form a circuit on a surface of the substrate. The wiring is typically made of, instead of aluminum, copper having low electric resistance and high reliability. Since, however, copper tends to be easily oxidized as compared to aluminum, it is required to plate a surface of the copper wiring with a metal having high electromigration resistance in order to suppress the surface of the copper wiring from being oxidized.

A plating process is performed by supplying an electroless plating liquid onto the surface of the substrate on which the copper wiring is formed. For example, Patent Document 1 describes a plating apparatus including a substrate rotating device configured to rotate the substrate, a nozzle configured to discharge the plating liquid onto the substrate, and a nozzle moving device configured to move the nozzle along the substrate. In the plating apparatus described in Patent Document 1, by supplying the electroless plating liquid while rotating the substrate, a uniform flow of the plating liquid is formed on the surface of the substrate. As a result, a plating process is performed on the entire surface of the substrate uniformly.

Patent Document 1: Japanese Patent Laid-open Publication No. 2009-249679

DISCLOSURE OF THE INVENTION

Problems to be Solved by the Invention

It is known that the plating process using the electroless plating liquid is affected by reaction conditions such as a composition of the plating liquid, a temperature of the plating liquid, and so forth. When supplying the plating liquid while rotating the substrate, the plating liquid flows from a central portion of the substrate toward a peripheral portion thereof. Accordingly, the temperature of the plating liquid on the substrate may decrease as it goes from the central portion of the substrate toward the peripheral portion thereof. For the reason, a reaction condition of the plating liquid may be different at the central portion and the peripheral portion of the substrate.

In view of the foregoing problems, the present example embodiment provides a plating apparatus, a plating method and a storage medium capable of solving the above problems.

Means for Solving the Problems

In one example embodiment, a plating apparatus performs a plating process by supplying a plating liquid onto a substrate. The plating apparatus includes a substrate holding/rotating device configured to hold and rotate the substrate; a discharging device configured to discharge the plating liquid toward the substrate held on the substrate holding/rotating device; and a controller configured to control the substrate holding/rotating device and the discharging device. Further, the discharging device includes a first nozzle having a multiple number of discharge openings arranged in a radial direction of the substrate or having a discharge opening extended in the radial direction of the substrate; and a second nozzle having a discharge opening configured to be positioned closer to a central portion of the substrate than the discharge opening of the first nozzle.

In another example embodiment, a plating method performs a plating process by supplying a plating liquid onto a substrate. The plating method includes loading the substrate on a substrate holding/rotating device; supplying a pre-treatment liquid for performing a pre-reatment onto the substrate; and discharging, after the pre-treatment liquid is supplied onto the substrate, the plating liquid toward the substrate through a discharging device. Further, the discharging device includes a first nozzle having a multiple number of discharge openings arranged in a radial direction of the substrate or having a discharge opening extended in the radial direction of the substrate; and a second nozzle having a discharge opening configured to be positioned closer to a central portion of the substrate than the discharge opening of the first nozzle. Furthermore, the plating liquid is discharged toward the substrate from at least one of the first nozzle and the second nozzle.

In yet another example embodiment, a computer-readable storage medium has stored thereon a computer-executable instructions that, in response to execution, cause a plating apparatus to perform a plating method of performing a plating process by supplying a plating liquid onto a substrate. Further, the plating method includes loading the substrate on a substrate holding/rotating device; supplying a pre-treatment liquid for performing a pre-treatment onto the substrate; and discharging, after the pre-treatment liquid is supplied onto the substrate, the plating liquid toward the substrate through a discharging device. Furthermore, the discharging device includes a first nozzle having a multiple number of discharge openings arranged in a radial direction of the substrate or having a discharge opening extended in the radial direction of the substrate; and a second nozzle having a discharge opening configured to be positioned closer to a central portion of the substrate than the discharge opening of the first nozzle. Moreover, the plating liquid is discharged toward the substrate from at least one of the first nozzle and the second nozzle.

Effect of the Invention

In accordance with the example embodiments, a discharging device configured to discharge a plating liquid toward a substrate includes a first nozzle having a multiple number of discharge openings arranged in a radial direction of the substrate or having a discharge opening extended in the radial direction of the substrate; and a second nozzle having a discharge opening configured to be positioned closer to a central portion of the substrate than the discharge opening of the first nozzle. With this configuration, it is possible to supply the plating liquid onto the central portion of the substrate or onto the vicinity of the central portion of the substrate by the second nozzle and, also, possible to supply the plating liquid directly onto a certain region on the substrate at a peripheral portion of the substrate outer than the central portion thereof by the first nozzle. Therefore, as compared to a case where only the plating liquid having passed through the central portion or the vicinity of the central portion of the substrate reaches the certain region, the temperature of the plating liquid reaching the certain region can be increased. Thus, it is possible to suppress a discrepancy between a reaction condition of the plating liquid at the central portion of the substrate and a reaction condition of the plating liquid at the peripheral portion of the substrate.

DETAILED DESCRIPTION

Hereinafter, an example embodiment will be described with reference to FIG. 1 to FIG. 9E. First, referring to FIG. 1, an overall plating system 1 in accordance with the example embodiment will be elaborated.

(Plating System)

Figure 1:
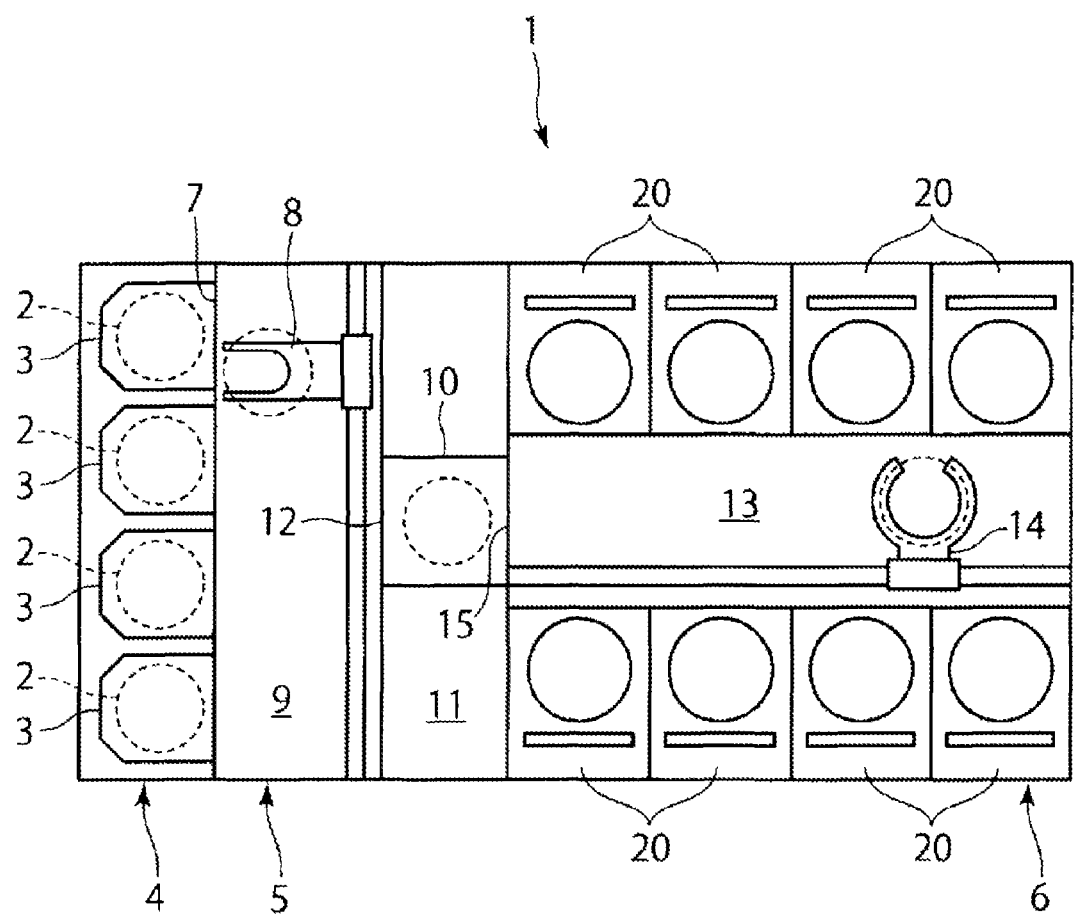
FIG. 1 is a plane view illustrating a schematic configuration of a plating system in accordance with an example embodiment.

As depicted in FIG. 1, the plating system 1 includes a substrate loading/unloading chamber 5 and a substrate processing chamber 6. The substrate loading/unloading chamber 5 is configured to mount thereon a carrier 3 accommodating a multiple number (e.g., 25 sheets) of substrates 2 (herein, semiconductor wafers), and is configured to load and unload the substrates 2 by a preset number. The substrate processing chamber 6 is configured to perform various processes such as a plating process and a cleaning process on the substrates 2. The substrate loading/unloading chamber 5 and the substrate processing chamber 6 are arranged adjacent to each other.

(Substrate Loading/Unloading Chamber)

The substrate loading/unloading chamber 5 includes a carrier mounting unit 4; a transfer chamber 9 accommodating therein a transfer device 8; and a substrate transit chamber 11 accommodating therein a substrate transit table 10. Within the substrate loading/unloading chamber 5, the transfer chamber 9 and the substrate transit chamber 11 are connected to and communicate with each other via a transit opening 12. The carrier mounting unit 4 mounts thereon a multiple number of carriers 3, and each of the carriers 3 accommodates therein a multiple number of substrates 2 while holding the substrates 2 horizontally. In the transfer chamber 9, the substrates 2 are transferred, and in the substrate transit chamber 11, the substrates 2 are transited to and from the substrate processing chamber 6.

In this substrate loading/unloading chamber 5, the substrates 2 are transferred by the transfer device 8 between a single carrier 3 mounted on the carrier mounting unit 4 and the substrate transit table 10 by a preset number.

(Substrate Processing Chamber)

The substrate processing chamber 6 includes a substrate transfer unit 13 extended in a forward-backward direction at a central portion thereof; and a multiple number of plating apparatuses 20 arranged side by side in the forward-backward direction at two opposite sides of the substrate transfer unit 13 and configured to perform a plating process by supplying a plating liquid onto the substrates 2.

The substrate transfer unit 13 includes a substrate transfer device 14 configured to be movable in the forward-backward direction. Further, the substrate transfer unit 13 communicates with the substrate transit table 10 of the substrate transit chamber 11 via a substrate loading/unloading opening 15.

In this substrate processing chamber 6, the substrates 2 are transferred into each of the plating apparatuses 20 one by one by the substrate transfer device 14 of the substrate transfer unit 13 while held on the substrate transfer device 14 horizontally. Further, in each of the plating apparatuses 20, a cleaning process and a plating process are performed on the substrates 2 one by one.

Except that the respective plating apparatuses 20 use different kinds of plating liquids, the respective plating apparatuses 20 have substantially the same configuration. Thus, hereinafter, a configuration of a single plating apparatus 20 among the multiple number of plating apparatuses 20 will be explained on behalf of the others.

(Plating Apparatus)

Figure 2:
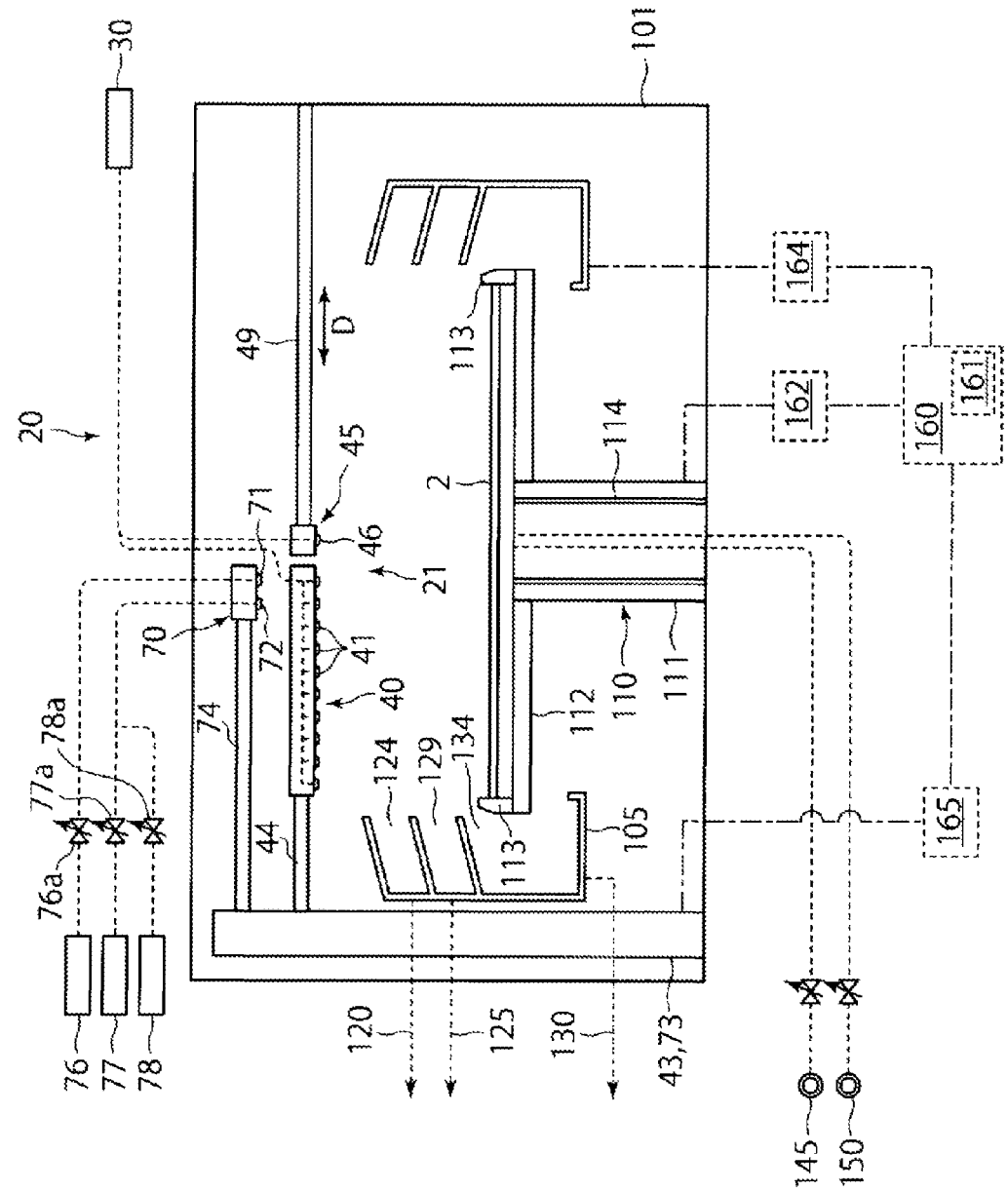
FIG. 2 is a side view illustrating a plating apparatus in accordance with the example embodiment.
Figure 3:
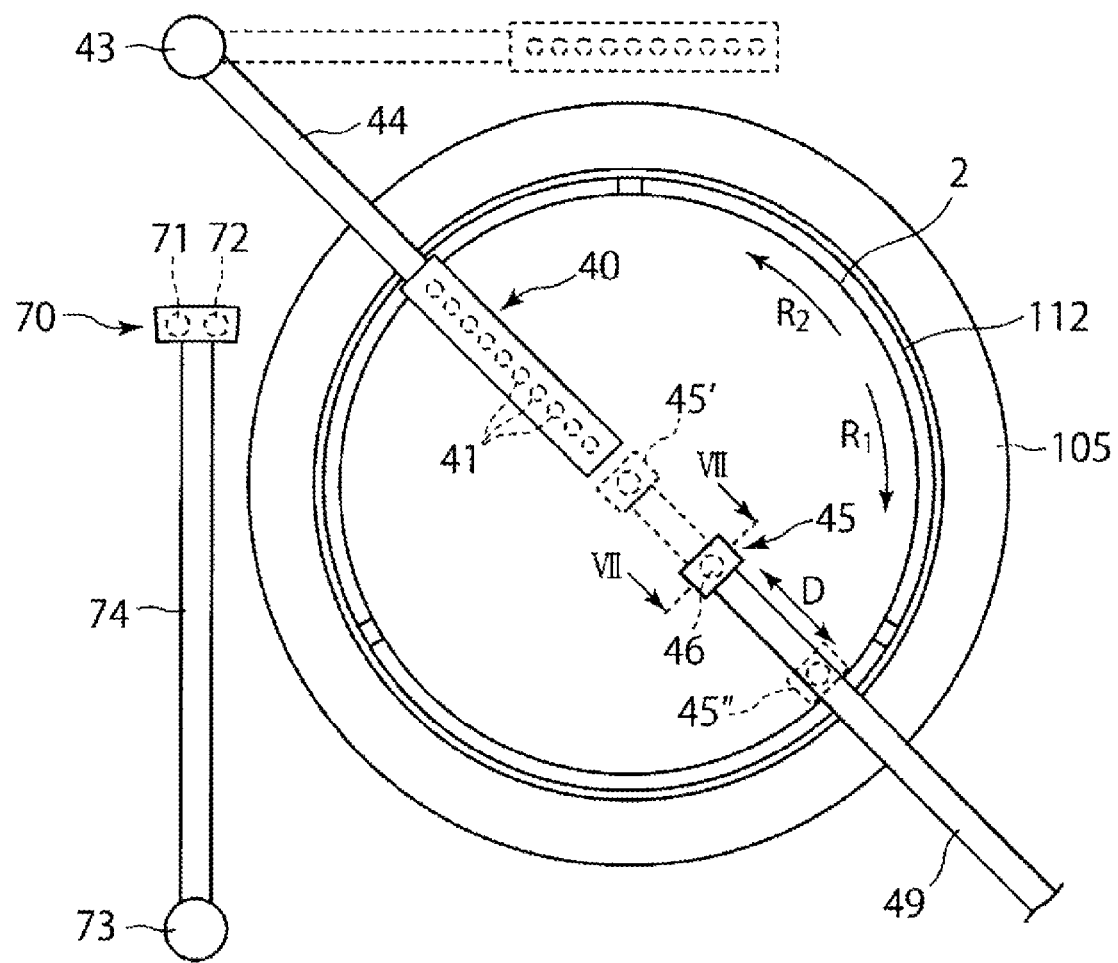
FIG. 3 is a plane view of the plating apparatus shown in FIG. 2.

Below, referring to FIG. 2 and FIG. 3, the plating apparatus 20 will be described. FIG. 2 and FIG. 3 are a side view and a plane view illustrating the plating apparatus 20, respectively.

The plating apparatus 20 includes, as illustrated in FIG. 2 and FIG. 3, a substrate holding/rotating device 110 configured to hold and rotate a substrate 2 within a casing 101; a discharging device 21 configured to discharge a plating liquid toward a surface of the substrate 2 held on the substrate holding/rotating device 110; a plating liquid supplying device 30 configured to supply the plating liquid to the discharging device 21; liquid draining devices 120, 125 and 130 configured to drain the plating liquid dispersed from the substrate 2 and collected in draining openings 124, 129 and 134 of a cup 105 which is configured to be move up and down by an elevating device 164; and a controller 160 configured to control the substrate holding/rotating device 110, the discharging device 21 and the plating liquid supplying device 30.

(Substrate Holding/Rotating Device)

The substrate holding/rotating device 110 includes, as illustrated in FIG. 2 and FIG. 3, a hollow cylindrical rotation shaft 111 vertically extended within the casing 101; a turntable 112 provided at an upper end portion of the rotation shaft 111; a wafer chuck 113 disposed on a peripheral portion of a top surface of the turntable 112 to support the substrate 2; and a rotating device 162 configured to rotate the rotation shaft 111. The rotating device 162 is controlled by the controller 160, and the rotation shaft 111 is rotated by the rotating device 162. As a result, the substrate 2 supported on the wafer chuck 113 is rotated.

(Discharging Device)

Now, the discharging device 21 configured to discharge a plating liquid or the like toward the substrate 2 will be elaborated. The discharging device 21 includes a first nozzle 40 and a second nozzle 45 which are configured to discharge a plating liquid for chemical reduction plating, such as a CoP plating liquid, toward the substrate 2. The plating liquid for the chemical reduction plating is supplied to the first nozzle 40 and the second nozzle 45 from the plating liquid supplying device 30. Details of the first nozzle 40 and the second nozzle 45 will be elaborated later.

The discharging device 21 may further include, as illustrated in FIG. 2, a third nozzle 70 having a discharge opening 71 and a discharge opening 72. As depicted in FIG. 2 and FIG. 3, the third nozzle 70 is provided at a leading end portion of an arm 74. The arm 74 is fastened to a supporting shaft 73 which is configured to be extended in a vertical direction and rotated by a rotating device 165.

The discharge opening 71 of the third nozzle 70 is connected via a valve 76a to a plating liquid supplying device 76 configured to supply a plating liquid for displacement plating such as a Pd plating liquid. The discharge opening 72 is connected via a valve 77a to a cleaning liquid supplying device 77 configured to supply a cleaning liquid. By providing the third nozzle 70 having the above-described configuration, it is possible to perform a plating process by using the plating liquid for the displacement plating and a cleaning process as well as a plating process by using the plating liquid for the chemical reduction plating within a single plating apparatus 20.

Further, as depicted in FIG. 2, a rinse liquid supplying device 78 configured to supply a pre-treatment liquid for performing a pre-treatment prior to a plating process, e.g., a rinse liquid such as pure water, may also be further connected to the discharge opening 72 of the third nozzle 70 via a valve 78a. In this configuration, by controlling opening and closing of the valves 77a and 78a appropriately, either one of the cleaning liquid and the rinse liquid may be selectively discharged onto the substrate 2 from the discharge opening 72.

(First Nozzle)

As illustrated in FIG. 2 and FIG. 3, the first nozzle 40 includes a multiple number of discharge openings 41. The first nozzle 40 is provided at a leading end portion of an arm 44. The arm 44 is fastened to a supporting shaft 43 which is configured to be extended in a vertical direction and rotated by the rotating device 165.

As depicted in FIG. 3, the multiple number of discharge openings 41 of the first nozzle 40 are arranged side by side in a radial direction of the substrate 2. Accordingly, it is possible to supply the plating liquid directly from the first nozzle 40 onto a region on the substrate 2 within a certain range in the radial direction of the substrate 2. Here, "supplying the plating liquid directly" implies, that the plating liquid is directly dropped on the certain region of the substrate 2 without being diffused to the certain region of the substrate 2 by a centrifugal force generated when the substrate 2 is rotated after the plating liquid is dropped on a region closer to a central portion of the substrate 2.

In general, a temperature of an atmosphere within the plating apparatus or a temperature of the substrate 2 is set to be lower than a temperature of the plating liquid when the plating liquid is discharged toward the substrate 2 from the first nozzle 40 or the second nozzle 45. Accordingly, when the plating liquid discharged onto a central portion of the substrate 2 or the vicinity of the central portion of the substrate 2 flows outward on the substrate 2 by the centrifugal force, the temperature of the plating liquid may decrease as it goes from the central portion of the substrate 2 toward a peripheral portion thereof. Therefore, in a plating process in which the plating liquid is dropped only on the central portion of the substrate 2 or the vicinity thereof and the plating liquid is diffused onto the entire region of the substrate 2 by the centrifugal force, the temperature of the plating liquid on the substrate 2 may decrease gradually as it goes from the central portion of the substrate 2 toward the peripheral portion thereof.

Here, in accordance with the present example embodiment, by providing the first nozzle 40, it is possible to directly supply the plating liquid from the first nozzle 40 onto the region on the substrate 2 within the certain range in the radial direction of the substrate 2. Therefore, it is possible to suppress a discrepancy between a temperature of the plating liquid reaching the central portion of the substrate and a temperature of the plating liquid reaching the peripheral portion of the substrate outer than the central portion thereof.

(Second Nozzle)

Now, the second nozzle 45 will be elaborated. As depicted in FIG. 2 and FIG. 3, the second nozzle 45 includes a discharge opening 46. Further, the second nozzle 45 is provided at a leading end portion of an arm 49, and the arm 49 is configured to be movable back and forth in the radial direction of the substrate 2 (i.e., in a direction indicated by an arrow D in FIG. 2 and FIG. 3). Accordingly, the second nozzle 45 is configured to be movable between a central position, where the discharge opening 46 of the second nozzle 45 is positioned closer to the central portion of the substrate 2 than each of the discharge openings 41 of the first nozzle 40, and a peripheral position outer than the central position. In FIG. 3, the second nozzle at the central position is indicated by a reference numeral 45', and the second nozzle at the peripheral position is indicated by a reference numeral 45".

Figure 7:
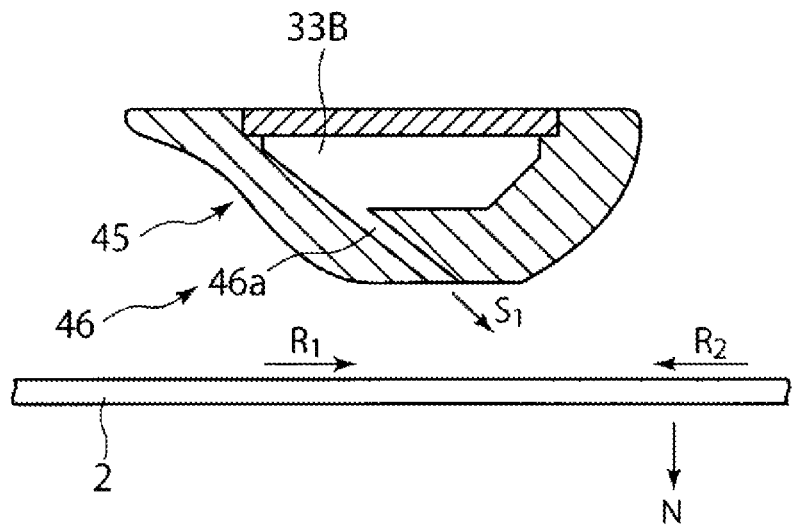
FIG. 7 is a cross sectional view of a second nozzle taken along a line VII-VII of FIG. 3.

Referring to FIG. 7, a specific shape of the discharge opening 46 of the second nozzle 45 will be explained. FIG. 7 is a cross sectional view of the second nozzle 45, taken along a line VII-VII of FIG. 3. In FIG. 3 and FIG. 7, an arrow marked by a notation $R_1$ indicates a rotational direction (first rotational direction) when the substrate 2 is rotated in a clockwise direction, and an arrow marked by a notation $R_2$ indicates a rotational direction (second rotational direction) when the substrate 2 is rotated in a counterclockwise direction.

As illustrated in FIG. 7, the discharge opening 46 of the second nozzle 45 includes an inclined discharge opening 46a through which the plating liquid 35 is discharged toward the substrate 2 along a direction (indicated by an arrow $S_1$ in FIG. 7) inclined with respect to a normal direction (indicated by an arrow N of FIG. 7) of the substrate 2. Here, the term "inclined" means that the direction of the arrow N and the direction of the arrow $S_1$ are neither parallel nor orthogonal to each other.

As illustrated in FIG. 7, the inclined discharge opening 46a is formed such that the inclined direction $S_1$ thereof corresponds to the first rotational direction $R_1$. Here, the statement that "the inclined direction $S_1$ of the inclined discharge opening 46a corresponds to the first rotational direction $R_1$" implies that a vector $S_1$ indicating a discharging direction of the plating liquid discharged from the inclined discharge opening 46a does not have a component of the second rotational direction $R_2$ of the substrate 2 but has a component of the first rotational direction $R_1$ of the substrate 2, as shown in FIG. 7. Further, the statement that "the inclined direction $S_1$ of the inclined discharge opening 46a corresponds to the first rotational direction $R_1$" has the same meaning as the statement that "the first rotational direction $R_1$ corresponds to the inclined direction $S_1$ of the inclined discharge opening 46a."

The inclination degree of the inclined discharge opening 46a may not be particularly limited. By way of example, but not limitation, the inclined discharge opening 46a may be formed such that an angle formed between the inclined direction $S_1$ and the normal direction N of the substrate falls within a range of, e.g., about 5° to about 60°.

The advantage of the configuration in which the discharge opening 46 includes the inclined discharge opening 46a as described above will be discussed. The plating liquid 35 is discharged from the inclined discharge opening 46a onto the substrate 2 which is being rotated. In such a case, a magnitude of an impact applied to the substrate 2 by the plating liquid when the plating liquid 35 collides with the substrate 2 may depend on a moving speed of the plating liquid 35 in the vertical direction, a difference between a moving speed of the substrate 2 and a moving speed of the plating liquid 35 in a horizontal direction on a region with which the plating liquid collides. Here, in the configuration where the inclined direction $S_1$ of the discharge opening 46a corresponds to the rotational direction of the substrate 2, the difference between the moving speeds of the substrate 2 and the plating liquid 35 in the horizontal direction on the region with which the plating liquid 35 collides would be decreased. Thus, by forming the inclined discharge opening 46a such that the inclined direction $S_1$ of the inclined discharge opening 46a corresponds to the rotational direction of the substrate 2, it is possible to weaken the impact applied to the substrate 2 by the plating liquid 35 when the plating liquid 35 collides with the substrate 2. That is, when discharging the plating liquid 35 toward the substrate 2 by using the inclined discharge opening 46a, the impact applied to the substrate 2 by the plating liquid 35 may be smaller in a case that the substrate 2 is rotated in the first rotational direction $R_1$ than in a case that the substrate 2 is rotated in the second rotational direction $R_2$.

(Plating Liquid Supplying Device)

Figure 4:
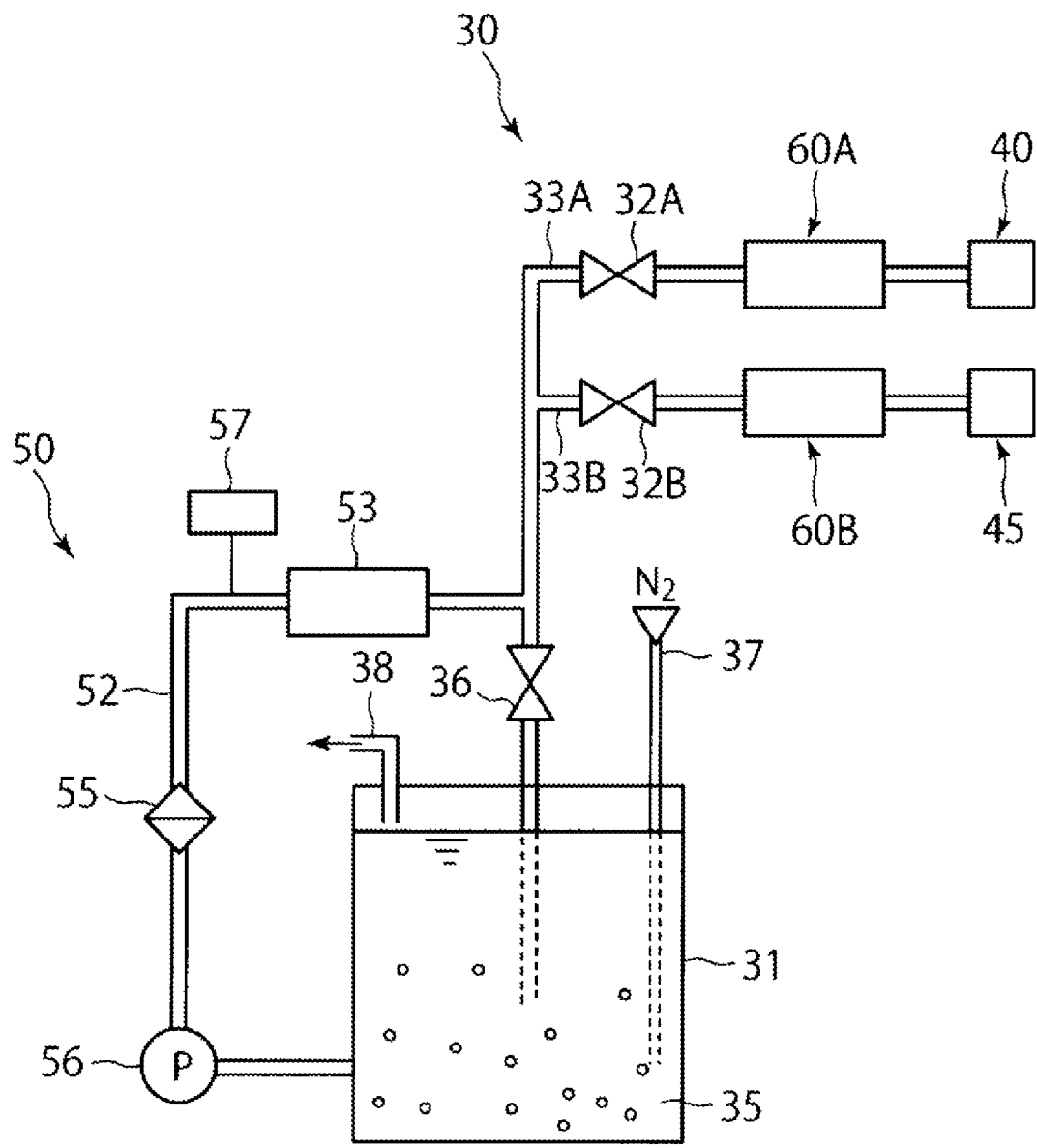
FIG. 4 is a diagram illustrating a plating liquid supplying device in accordance with the example embodiment.

Now, the plating liquid supplying device 30 configured to supply the plating liquid for the chemical reduction plating, such as the CoP plating liquid, to the first nozzle 40 and the second nozzle 45 of the discharging device 21 will be described. FIG. 4 illustrates the plating liquid supplying device 30.

As illustrated in FIG. 4, the plating liquid supplying device 30 includes a supply tank 31 configured to store therein the plating liquid 35; a first supply line 33A configured to supply the plating liquid 35 of the supply tank 31 to the first nozzle 40; and a second supply line 33B configured to supply the plating liquid 35 of the supply tank 31 to the second nozzle 45. A first valve 32A is provided at the first supply line 33A, and a second valve 32B is provided at the second supply line 33B.

Further, as depicted in FIG. 4, a tank heating unit 50 configured to heat the plating liquid 35 to a storage temperature is provided at the supply tank 31. Further, a first heating unit 60A configured to heat the plating liquid 35 to a first discharge temperature higher than the storage temperature is provided at the first supply line 33A between the tank heating unit 50 and the first nozzle 40. Likewise, a second heating unit 60B configured to heat the plating liquid 35 to a second discharge temperature higher than the storage temperature is provided at the second supply line 33B between the tank heating unit 50 and the second nozzle 45. The tank heating unit 50, the first heating unit 60A and the second heating unit 60B will be described later in detail.

The aforementioned "storage temperature" is set to be a certain temperature higher than a room temperature and lower than a temperature (plating temperature) at which precipitation of metal ions progresses through self-reaction within the plating liquid 35. Further, the "first discharge temperature" and the "second discharge temperature" are set to be certain temperatures equal to or higher than the plating temperature. In accordance with the present example embodiment, the plating liquid 35 is heated to a temperature equal to or higher than the plating temperature through two stages.

Accordingly, as compared to a case where the plating liquid 35 is heated to a temperature equal to or higher than the plating temperature within the supply tank 31, it is possible to suppress deactivation of a reducing agent in the plating liquid 35 or evaporation of a component of the plating liquid 35 within the supply tank 31. Therefore, a decrease of lifetime of the plating liquid 35 can be suppressed.

Further, as compared to a case where the plating liquid 35 is stored at the room temperature within the supply tank 31 and later heated to a temperature equal to or higher than the plating temperature by the first heating unit 60A and the second heating unit 60B, it is possible to heat the plating liquid 35 to the temperature equal to or higher than the plating temperature promptly with low energy. Accordingly, precipitation of metal ions can be suppressed.

Various kinds of chemical liquids are supplied into the supply tank 31 from a multiple number of chemical liquid supplying sources (not illustrated) in which various kinds of components of the plating liquid 35 are stored. By way of non-limiting example, chemical liquids such as a $CoSO_4$ metal salt containing Co ions, a reducing agent (e.g., hypophosphorous acid, etc.) and an additive are supplied in the supply tank 31. Here, flow rates of the various kinds of the chemical liquids are controlled so that the components of the plating liquid 35 stored in the supply tank 31 are appropriately adjusted.

(Tank Heating Unit)

The tank heating unit 50 includes, as illustrated in FIG. 4, a circulating line 52 serving as a circulation path of the plating liquid 35 in the vicinity of the supply tank 31; a heater 53 provided at the circulating line 52 and configured to heat the plating liquid 35 to the storage temperature; and a pump 56 provided at the circulating line 52 and configured to circulate the plating liquid 35. By providing the tank heating unit 50, it is possible to heat the plating liquid 35 within the supply tank 31 to the aforementioned storage temperature while circulating the plating liquid 35 in the vicinity of the supply tank 31.

Further, as illustrated in FIG. 4, the first supply line 33A and the second supply line 33B are connected to the circulating line 52. In the shown example, when a valve 36 is opened and the first and second valves 32A and 32B are closed, the plating liquid 35 having passed through the heater 53 is returned back into the supply tank 31. Meanwhile, when the valve 36 is closed and the first and second valves 32A and 32B are opened, the plating liquid 35 having passed through the heater 53 is introduced into the first nozzle 40 and the second nozzle 45.

Moreover, as illustrated in FIG. 4, a filter 55 may be provided at the circulating line 52. With this configuration, when heating the plating liquid 35 by the tank heating unit 50, various kinds of impurities included in the plating liquid 35 can be removed. Furthermore, as depicted in FIG. 4, a monitoring unit 57 configured to monitor characteristics of the plating liquid 35 may be provided at the circulating line 52. The monitoring unit 57 may be implemented by a temperature monitor configured to monitor the temperature of the plating liquid 35, a pH monitor configured to monitor a pH value of the plating liquid 35, or the like.

As illustrated in FIG. 4, the plating liquid supplying device 30 may further include a degassing unit 37 connected to the supply tank 31 and configured to remove dissolved oxygen and dissolved hydrogen in the plating liquid 35 stored in the supply tank 31. The degassing unit 37 may be configured to supply an inert gas such as nitrogen into the supply tank 31. In this case, by dissolving the inert gas such as nitrogen in the plating liquid 35, the other gases such as the oxygen or the hydrogen already dissolved in the plating liquid 35 can be removed from the plating liquid 35. The oxygen or hydrogen removed from the plating liquid 35 is exhausted out of the supply tank 31 by an exhaust unit 38.

(First Heating Unit)

Figure 5:
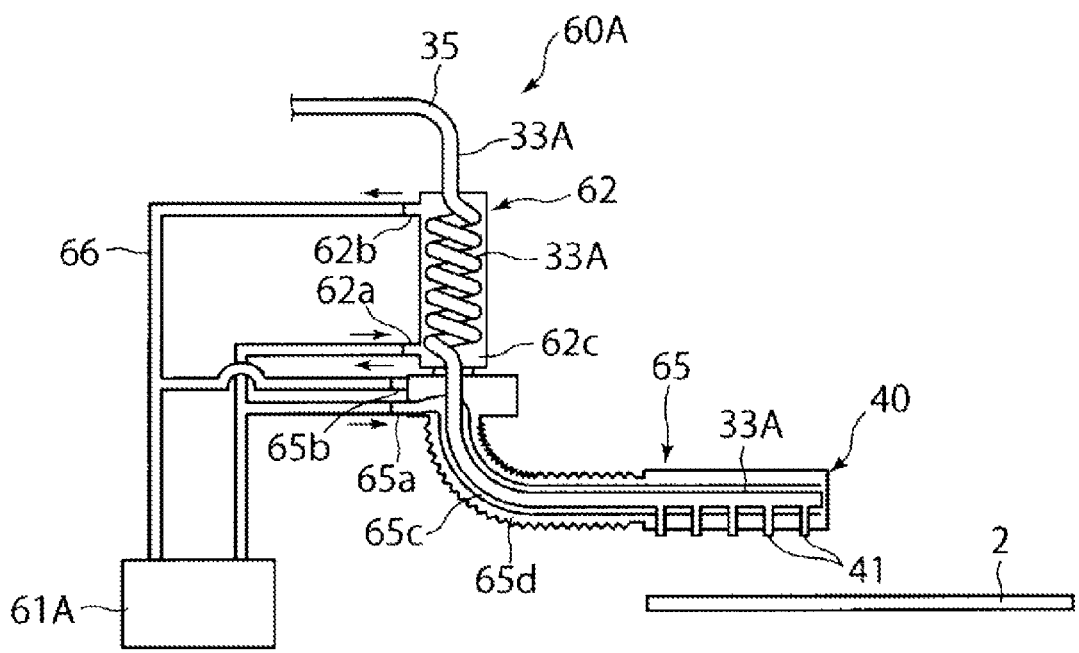
FIG. 5 is a diagram illustrating a first heating device of the plating liquid supplying device.

Now, referring to FIG. 5, the first heating unit 60A will be elaborated. The first heating unit 60A is configured to further heat the plating liquid 35, which is heated to the storage temperature by the tank heating unit 50, to the first discharge temperature. The first heating unit 60A includes, as illustrated in FIG. 5, a first temperature medium supplying unit 61A and a temperature controller 62. The first temperature medium supplying unit 61A is configured to heat a certain heat transfer medium to the first discharge temperature or a temperature higher than the first discharge temperature. The temperature controller 62 is provided at the first supply line 33A and configured to transfer heat of the heat transfer medium from the first temperature medium supplying unit 61A to the plating liquid 35 within the first supply line 33A. Further, as illustrated in FIG. 5, the first heating unit 60A may further include a temperature maintaining unit 65 extended to an inside of the first nozzle 40 and configured to maintain the temperature of the plating liquid 35 passing through the first supply line 33A located within the first nozzle 40 at the first discharge temperature.

The temperature controller 62 includes a supply opening 62a through which the heat transfer medium (e.g., hot water) for temperature control is introduced from the first temperature medium supplying unit 61A; and a draining opening 62b through which the heat transfer medium is discharged out. The heat transfer medium supplied through the supply opening 62a comes into contact with the first supply line 33A while the heat transfer medium flows in a space 62c within the temperature controller 62. With this configuration, the plating liquid 35 flowing through the first supply line 33A is heated to the first discharge temperature. After used for heating the plating liquid 35, the heat transfer medium is discharged out through the draining opening 62b.

Desirably, the first supply line 33A within the temperature controller 62 may be formed to have a spiral shape, as illustrated in FIG. 5. Accordingly, a contact area between the heat transfer medium and the first supply line 33A can be increased, so that the heat of the heat transfer medium can be transferred to the plating liquid 35 efficiently.

The temperature maintaining unit 65 is configured to maintain, before the plating liquid 35 heated to the first discharge temperature by the temperature controller 62 is discharged from the first nozzle 40, the temperature of the plating liquid 35. The temperature maintaining unit 65 includes, as illustrated in FIG. 5, a heat insulation pipe 65c extended to be in contact with the first supply line 33A within the temperature maintaining unit 65; a supply opening 65a through which the heat transfer medium supplied from the first temperature medium supplying unit 61A is introduced into the heat insulation pipe 65c; and a draining opening 65b through which the heat transfer medium is discharged. The heat insulation pipe 65c is extended to the vicinity of a leading end portion of the first nozzle 40 along the first supply line 33A. With this configuration, the temperature of the plating liquid 35 discharged from the discharge openings 41 of the first nozzle 40 can be uniformly maintained at the first discharge temperature.

As shown in FIG. 5, the heat insulation pipe 65c may be opened within the first nozzle 40, while communicating with a space 65d within the temperature maintaining unit 65. In this configuration, the temperature maintaining unit 65 may have a triple structure (triple-pipe structure) including the first supply line 33A located at a central portion of a cross section thereof; the heat insulation pipe 65c surrounding the first supply line 33A to be thermally in contact with the first supply line 33A; and the space 65d surrounding the heat insulation pipe 65c. The heat transfer medium introduced through the supply opening 65a serves to maintain the temperature of the plating liquid 35 through the heat insulation pipe 65c until the heat transfer medium reaches the leading end portion of the first nozzle 40. Then, the heat transfer medium is discharged from the draining opening 65b after passing through the space 65d within temperature maintaining unit 65. The heat transfer medium flowing in the space 65d serves to thermally isolate the heat transfer medium flowing in the heat insulation pipe 65c (and the plating liquid 35 flowing in the first supply line 33A inside the heat insulation pipe 65c) from the atmosphere outside the temperature maintaining unit 65. Accordingly, a heat loss of the heat transfer medium flowing in the heat insulation pipe 65c can be suppressed, and the heat may be efficiently transferred from the heat transfer medium flowing in the heat insulation pipe 65c to the plating liquid 35 flowing in the first supply line 33A.

FIG. 5 illustrates an example where the heat transfer medium supplied into the temperature controller 62 and the heat transfer medium supplied into the temperature maintaining unit 65 are commonly supplied from the first temperature medium supplying unit 61A. However, the example embodiment may not be limited thereto, and the heat transfer medium supplied into the temperature controller 62 and the heat transfer medium supplied into the temperature maintaining unit 65 may be supplied from individual heat transfer medium supplying sources.

(Second Heating Unit)

Figure 6:
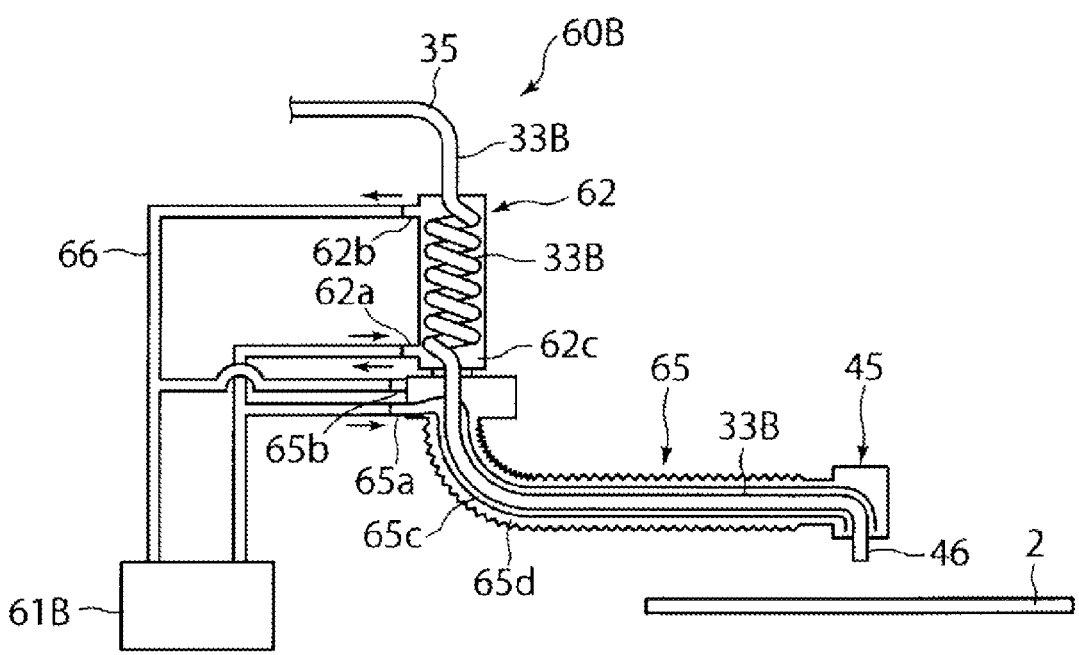
FIG. 6 is a diagram illustrating a second heating device of the plating liquid supplying device.

Now, referring to FIG. 6, the second heating unit 60B will be elaborated. The second heating unit 60B is configured to heat the plating liquid 35, which is heated to the storage temperature by the tank heating unit 50, to the second discharge temperature. The second heating unit 60B includes, as illustrated in FIG. 6, a second temperature medium supplying unit 61B and a temperature controller 62. The second temperature medium supplying unit 61B is configured to heat a certain heat transfer medium to the second discharge temperature or a temperature higher than the second discharge temperature. The temperature controller 62 is provided at the second supply line 33B and configured to transfer heat of the heat transfer medium from the second temperature medium supplying unit 61B to the plating liquid 35 within the second supply line 33B. Further, as illustrated in FIG. 6, the second heating unit 60B may further include a temperature maintaining unit 65 extended to the inside of the second nozzle 45 and configured to maintain the temperature of the plating liquid 35 passing through the second supply line 33B located within the second nozzle 45 at the second discharge temperature.

The configuration of the second heating unit 60B is substantially the same as the configuration of the first heating unit 60A shown in FIG. 5 except that the heat transfer medium is heated to the second discharge temperature or the temperature higher than the second discharge temperature by the second temperature medium supplying unit 61B. Parts of the second heating unit 60B which are the same as those of the first heating unit 60A will be assigned same reference numerals, and detailed description thereof will be omitted.

Further, the first heating unit 60A and the second heating unit 60B as described above are controlled by the controller 160 such that the first discharge temperature is higher than the second discharge temperature. That is, in the plating liquid supplying device 30 having the first heating unit 60A and the second heating unit 60B, the temperature of the plating liquid supplied to the first nozzle 40 is set to be higher than the temperature of the plating liquid supplied to the second nozzle 45. With this configuration, as will be discussed later, it is possible to suppress a discrepancy between the temperature of the plating liquid reaching the central portion of the substrate 2 and the temperature of the plating liquid reaching the peripheral portion of the substrate 2 outer than the central portion thereof.

(Liquid Draining Device)

Now, the liquid draining devices 120, 125 and 130 configured to drain the plating liquid or the cleaning liquid dispersed from the substrate 2 will be elaborated with reference to FIG. 2. As shown in FIG. 2, the cup 105 capable of being moved up and down by the elevating device 164 and having the draining openings 124, 129 and 134 is disposed within the casing 101. The liquid draining devices 120, 125 and 130 are configured to drain the liquids collected in the draining openings 124, 129 and 134, respectively.

The processing liquids dispersed from the substrate 2 are drained by the liquid draining devices 120, 125 and 130 through the draining openings 124, 129 and 134, respectively, while separated by their kinds. By way of example, the CoP plating liquid dispersed from the substrate 2 may be drained by the plating liquid draining device 120; the Pd plating liquid dispersed from the substrate 2 may be drained by the plating liquid draining device 125; and the cleaning liquid or the rinse liquid dispersed from the substrate 2 may be drained by the processing liquid draining device 130.

(Other Constituent Components)

As shown in FIG. 2, the plating apparatus 20 may further include a rear surface processing liquid supplying device 145 configured to supply a processing liquid to a rear surface of the substrate 2; and a rear surface gas supplying device 150 configured to supply a gas to the rear surface of the substrate 2.

The plating system 1 including the multiple number of plating apparatuses 20 having the above-described configuration is controlled by the controller 160 according to various kinds of programs recorded on a storage medium 161 provided in the controller 160. Therefore, various processes are performed on the substrate 2. Here, the storage medium 161 stores thereon various kinds of setup data or various kinds of programs such as a plating program to be described later. The storage medium 161 may be implemented by a computer-readable memory such as a ROM or a RAM, or a disk-type storage medium such as a hard disk, a CD-ROM, DVD-ROM or a flexible disk, as commonly known in the art.

(Plating Method)

In the present example embodiment, the plating system 1 and the plating apparatus 20 are controlled by the controller 160 to perform a plating process on the substrate 2 according to a plating program recorded on the storage medium 161. In the following description, a method of performing a Pd plating process on the substrate 2 by the displacement plating and then performing a Co plating process by the chemical reduction plating in a single plating apparatus 20 will be explained with reference to FIG. 8 and FIG. 9A to FIG. 9E.

(Substrate Loading Process and Substrate Receiving Process)

First, a substrate loading process and a substrate receiving process are performed. A single sheet of substrate 2 is loaded into the one plating apparatus 20 from the substrate transit chamber 11 by the substrate transfer device 14 of the substrate transfer unit 13. In the plating apparatus 20, the cup 105 is lowered to a preset position, and the loaded substrate 2 is held by the wafer chuck 113. Then, the cup 105 is raised by the elevating device 164 up to a position where an outer peripheral end portion of the substrate 2 faces the draining opening 134.

(Cleaning Process)

Thereafter, a cleaning process (block S301) including a rinse process, a pre-cleaning process and another rinse process is performed. First, the valve 78a of the rinse liquid supplying device 78 is opened, and a rinse liquid is supplied onto the surface of the substrate 2 through the discharge opening 72 of the third nozzle 70. Then, a pre-cleaning process is performed. First, the valve 77a of the cleaning liquid supplying device 77 is opened, and a cleaning liquid is supplied onto the surface of the substrate 2 through the discharge opening 72 of the third nozzle 70. Thereafter, the rinse liquid is also supplied onto the surface of the substrate 2 through the discharge opening 72 of the third nozzle 70 in the same manner as described above. The used rinse liquid and the used cleaning liquid are disposed of through the draining opening 134 of the cup 105 and the processing liquid draining device 130. Unless otherwise mentioned, in the cleaning process (block S301) and subsequent processes to be described below, the substrate 2 is being rotated in the first rotational direction $R_1$ by the substrate holding/rotating device 110.

(Pd plating process)

Subsequently, a Pd plating process (block S302) is performed. This Pd plating process is performed as a displacement plating process while the substrate 2 is not yet dried after the cleaning process is completed. By performing the displacement plating process while the substrate 2 is not yet dried, it may be possible to avoid a case where the displacement plating process is not effectively performed since copper or the like on a plating target surface of the substrate 2 is oxidized.

In the Pd plating process, the cup 105 is lowered by the elevating device 164 to a position where the draining opening 129 and the outer peripheral end portion of the substrate 2 face each other. Then, the valve 76a of the plating liquid supplying device 76 is opened, and a Pd-containing plating liquid is discharged onto the surface of the substrate 2 through the discharge opening 71 of the third nozzle 70 at a desired flow rate. As a result, Pd plating is performed on the surface of the substrate 2. The used plating liquid is drained out through the draining opening 129 of the cup 105. Thereafter, the used plating liquid drained out through the draining opening 129 is collected through the draining device 125. Then, the plating liquid is reused or wasted.

(Rinse Process)

Thereafter, as a pre-treatment to be performed prior to the Co plating process, a rinse process (block S303) is performed, for example. By way of example, in the rinse process (block S303), the rinse liquid is supplied onto the surface of the substrate 2 as a pre-treatment liquid.

(Co Plating Process)

Figure 8:
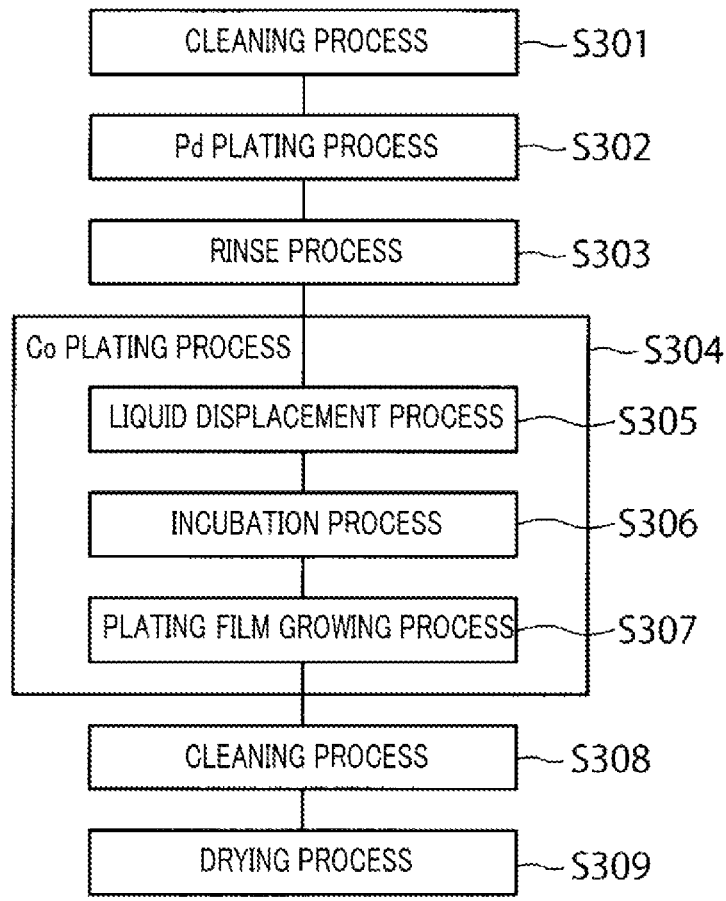
FIG. 8 is a flowchart for describing a plating method.

Then, a Co plating process (block S304) is performed in the same plating apparatus 20 as used in performing the above-described processes (blocks S301 to S303). This Co plating process (block S304) is performed as a chemical reduction plating process. The Co plating process (block S304) includes, as shown in FIG. 8, a liquid displacement process (block S305) (first process), an incubation process (block S306) (second process) and a plating film growing process (block S307) (third process).

In the Co plating process, an element that is precipitated to form a plating layer may not be limited to Co, and another element may also be precipitated at the same time. By way of example, when a plating liquid used in the Co plating process contains not only Co ions but also ions of other element, Co and the other element may be precipitated concurrently. Here, description will be provided for a case where Co ions and P ions are contained in the plating liquid and, thus, a plating layer (CoP) containing P as well as Co is formed. In the following description, even if the element other than Co is contained in the plating layer, the plating layer obtained through the Co plating process will be referred to as a "Co plating layer."

Among the aforementioned processes (blocks S305 to S307), the liquid displacement process (block S305) is a process for displacing the rinse liquid supplied on the substrate 2 in the rinse process (block S303) by the plating liquid 35 for forming CoP. The incubation process (block S306) is a process for forming an initial Co plating layer 84 on an entire region of a Pd plating layer 83 to be described later after performing the liquid displacement process (block S305). Here, the initial Co plating layer 84 refers to a plating layer having a thickness equal to or smaller than several tens of nanometers. Further, the plating film growing process (block S307) is a process for forming the Co plating layer 84 having a sufficient thickness equal to or larger than, e.g., 100 nanometers by allowing the plating reaction to further progress on the initial Co plating layer 84 formed in the incubation process (block S306).

Figure 9A:
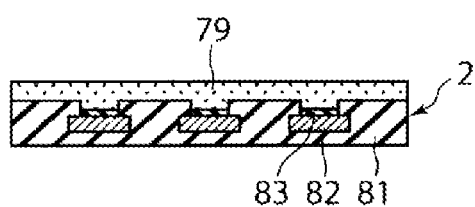
FIG. 9A to FIG. 9E are diagrams illustrating formation of a Co plating layer.

Below, the Co plating process will be described in detail with reference to FIG. 9A to FIG. 9E. FIG. 9A illustrates the substrate 2 after the Pd plating process (block S302) and the rinse process (block S303) are performed. As shown in FIG. 9A, the substrate 2 has an insulating layer 81 made of, e.g., an organic compound; and a wiring 82 made of, e.g., copper; and the Pd plating layer 83 that covers the wiring 82. Further, a rinse liquid 79 supplied in the rinse process (block S303) remains on the substrate 2. Unless otherwise mentioned, in the respective processes (blocks S305, S306 and S307) of the Co plating process (block S304), the discharge opening 46 of the second nozzle 45 is positioned closer to a central portion of the substrate 2 than each discharge opening 41 of the first nozzle 40.

Figure 9B:
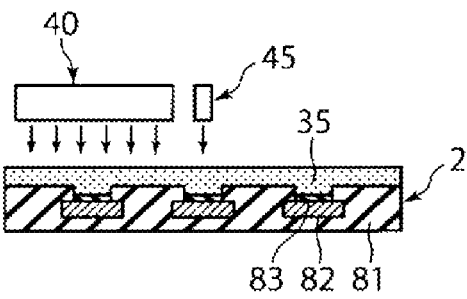

First, as shown in FIG. 9B, the plating liquid 35 heated to the first discharge temperature by the first heating unit 60A is discharged onto the surface of the substrate 2 from the discharge openings 41 of the first nozzle 40. Further, the plating liquid 35 heated to the second discharge temperature by the second heating unit 60B is also discharged onto the surface of the substrate 2 from the discharge opening 46 of the second nozzle 45. The plating liquid 35 discharged from the discharge openings 41 of the first nozzle 40 reaches a region on the substrate 2 within the certain range in the radial direction of the substrate 2, as illustrated in FIG. 9B. Further, the plating liquid 35 discharged from the discharge opening 46 of the second nozzle 45 reaches the substantially central portion of the substrate 2.

(Liquid Displacement Process)

By discharging the plating liquid 35 toward the substrate 2 by using the first and second nozzles 40 and 45, the rinse liquid 79 existing on the substrate 2 is displaced by the plating liquid 35 for forming CoP, as illustrated in FIG. 9B. Then, the liquid displacement process (block S305) is completed. Although varied depending on a size of the substrate 2 or a flow rate of the plating liquid 35, a time required for the liquid displacement process (block S305) may be in the range of, but not limited to, from about 1 second to about 2 minutes.

(Incubation Process)

Figure 9C:
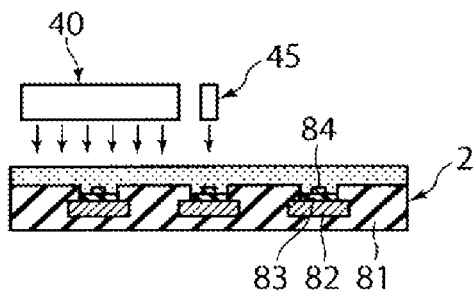
Figure 9D:
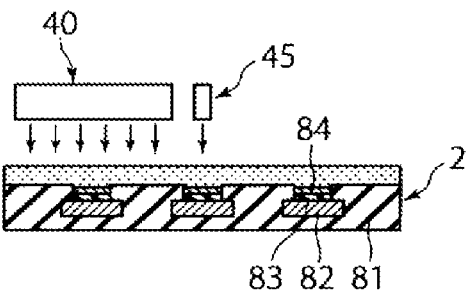

Now, the plating liquid 35 is discharged toward the substrate 2 by using the first and second nozzles 40 and 45. As a result, as depicted in FIG. 9C, the initial Co plating layer 84 is partially formed on the Pd plating layer 83. While discharging the plating liquid 35 toward the substrate 2, the initial Co plating layer 84 is formed on the entire region of the Pd plating layer 83, as shown in FIG. 9D. Then, the incubation process (block S306) is completed.

(Plating Film Growing Process)

Figure 9E:
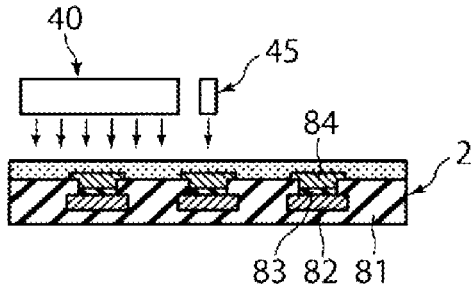

Subsequently, the plating liquid 35 is discharged toward the substrate 2 by using the first and second nozzles 40 and 45. Through this process, as illustrated in FIG. 9E, the thickness of the Co plating layer 84 on the Pd plating layer 83 reaches a preset thickness, e.g., about 1 μm. Then, the plating film growing process (block S307) is completed.

In the Co plating process (block S304), the cup 105 is lowered by the elevating device 164 to a position where the draining opening 124 and the outer peripheral end portion of the substrate 2 face each other. Accordingly, the used plating liquid 35 is drained out through the draining opening 124 of the cup 105. After drained, the used plating liquid 35 is collected through the draining device 120 and, then, reused or wasted.

(Cleaning Process)

Thereafter, a cleaning process (block S308) including a rinse process, a post-cleaning process and another rinse process is performed on the surface of the substrate 2 on which the Co plating process has been performed. Since the cleaning process (block S308) is substantially the same as the above-described cleaning process (block S301), detailed elaboration thereof will be omitted.

(Drying Process)

Then, a drying process (block S309) for drying the substrate 2 is performed. By way of example, by rotating the turntable 112, the liquid adhering to the substrate 2 may be dispersed outward by a centrifugal force, so that the substrate 2 may be dried. That is, the turntable 112 may serve as a drying device configured to dry the surface of the substrate 2.

As discussed above, in the single plating apparatus 20, the Pd plating is first performed on the surface of the substrate 2 by the displacement plating, and the Co plating is then performed by the chemical reduction plating.

Thereafter, the substrate 2 may be transferred into another plating apparatus 20 for Au plating. In this another plating apparatus 20, an Au plating process is performed on the surface of the substrate 2 by the displacement plating. Except that a plating liquid and a cleaning liquid different from those of the Pd plating process are used, the method of the Au plating is substantially the same as that of the Pd plating process as described above. Thus, detailed description thereof will be omitted here.

(Effect of Example Embodiment Depending on Temperature)

In accordance with the present example embodiment, the discharging device 21 configured to discharge the plating liquid 35 toward the substrate 2 includes the first nozzle 40 having the multiple number of discharge openings 41 arranged in the radial direction of the substrate 2; and the second nozzle 45 having the discharge opening 46 capable of being positioned closer to the central portion of the substrate 2 than each of the discharge openings 41 of the first nozzle 40, as described above. With this configuration, it is possible to supply the plating liquid 35 onto the central portion of the substrate 2 by the second nozzle 45 and, also, possible to supply the plating liquid 35 directly onto a certain region on the substrate 2 at the peripheral portion of the substrate outer than the central portion thereof by the first nozzle 40. Therefore, as compared to a case where only the plating liquid 35 having passed through the central portion of the substrate 2 is diffused to the certain region, the temperature of the plating liquid 35 reaching the certain region can be increased. Thus, it is possible to suppress a discrepancy between a reaction condition of the plating liquid 35 at the central portion of the substrate 2 and a reaction condition of the plating liquid 35 at the peripheral portion of the substrate 2. As a consequence, the thickness of the Co coating layer 84 formed on the substrate 2 can be uniformed on the entire region of the substrate 2.

In the plating method in accordance with the present example embodiment, as stated above, the substrate 2 is being rotated by the substrate holding/rotating device 110 during the plating process. Accordingly, not only the plating liquid 35 directly discharged from the first nozzle 40 but also the plating liquid 35 having passed through the central portion of the substrate 2 after discharged from the second nozzle 45 may also reach the certain region on the substrate 2 at the peripheral portion of the substrate 2 outer than the central portion thereof. In such a case, the plating liquid 35 directly supplied onto the certain region from the first nozzle 40 and the plating liquid 35 having passed through the central portion of the substrate 2 may be mixed with each other. As a result, the temperature of the plating liquid 35 on that certain region may become lower than the temperature (first discharge temperature) of the plating liquid 35 when it is discharged from the first nozzle 40.

Here, in accordance with the present example embodiment, the plating liquid supplying device 30 is configured to set the temperature (first discharge temperature) of the plating liquid supplied to the first nozzle 40 to be higher than the temperature (second discharge temperature) of the plating liquid supplied to the second nozzle 45. Accordingly, even if the plating liquid 35 from the first nozzle 40 and the plating liquid 35 from the second nozzle 45 are mixed on the certain region, it is possible to suppress a discrepancy between a temperature of the mixed plating liquid 35 and the temperature (second discharge temperature) of the plating liquid 35 reaching the central portion of the substrate 2 from the second nozzle 45. Therefore, the thickness of the Co plating layer 84 formed on the substrate 2 can be substantially uniform on the entire region of the substrate 2 more securely.

Furthermore, besides the plating liquid 35 directly supplied from the discharge openings 41 of the first nozzle 40 and the plating liquid 35 having passed through the central portion of the substrate 2 after discharged from the second nozzle 45, the plating liquid discharged from the other discharge openings 41 of the first nozzle 40 and then having passed through a region of the substrate 2 other than the central portion thereof may also reach the peripheral portion of the substrate 2. Thus, a decrease of the temperature of the plating liquid 35 caused by the mixture of the plating liquid 35 from those various paths may be most remarkable at the peripheral portion of the substrate 2. For this reason, desirably, each discharge opening 41 of the first nozzle 40 is configured to supply the plating liquid 35 directly onto the vicinity of the peripheral portion of the substrate 2. With this configuration, it is possible to suppress a discrepancy between a reaction condition of the plating liquid 35 at the peripheral portion of the substrate 2 and a reaction condition of the plating liquid 35 at the central portion of the substrate or in the vicinity of the central portion of the substrate 2. As a consequence, the thickness of the Co plating layer 84 formed on the substrate 2 can be substantially uniform on the entire region of the substrate 2 more securely.

(Effect of Example Embodiment Depending on Discharging Angle)

Further, in accordance with the example embodiment, the discharge opening 46 of the second nozzle 45 includes the inclined discharge opening 46a through which the plating liquid 35 is discharged toward the substrate 2 along the inclined direction $S_1$ inclined with respect to the normal direction N of the substrate 2. The inclined direction $S_1$ of the inclined discharge opening 46a corresponds to the first rotational direction $R_1$ of the substrate 2. With this configuration, it is possible to reduce an impact applied to the substrate 2 by the plating liquid 35 discharged on the central portion of the substrate 2. Thus, impediment of the incubation process (block S306) and the plating film growing process (block S307) at the central portion of the substrate 2 or in the vicinity of the central portion of the substrate 2 can be suppressed.

Figure 10:
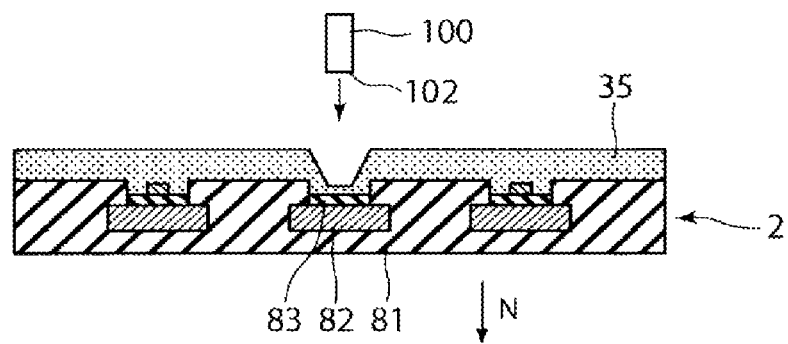
FIG. 10 is a diagram illustrating a state where a plating liquid is discharged toward a substrate from a nozzle having a vertical discharge opening in accordance with a comparative example.

Now, an effect achieved by the configuration in which the discharge opening 46 includes the inclined discharge opening 46a will be explained in comparison with a comparative example. FIG. 10 is a diagram illustrating a configuration example of discharging the plating liquid 35 toward the substrate 2 by using a nozzle 100 having a vertical discharge opening 102 through which the plating liquid 35 is discharged toward the central portion of the substrate 2 along the normal direction N of the substrate. In the comparative example shown in FIG. 10, components of moving speed of the plating liquid 35 are all in a vertical direction. Therefore, as compared to the case of the above-described example embodiment, a greater impact may be applied to the substrate 2 by the plating liquid 35 reaching the central portion of the substrate 2. In such a case, a state of the plating liquid 35 that exists on the central portion of the substrate 2 or in the vicinity thereof may become unstable. By way of example, as illustrated in FIG. 10, an amount of the plating liquid 35 existing on the substrate 2 may be decreased, or a flow of the plating liquid 35 may be severe at the central portion of the substrate 2 or in the vicinity thereof.

In general, in the plating liquid 35 for the chemical reduction plating, the reducing agent in the plating liquid 35 supplies electrons to the Pd plating layer 83 on the substrate 2, and metal ions (e.g., Co ions) on the Pd plating layer 83 receive these electrons, so that a metal (Co) is precipitated on the Pd plating layer 83. In this case, it seems that a certain layer for transferring the electrons is formed between the plating liquid 35 and the Pd plating layer 83. By way of example, an electric double layer, in which pairs of positively and negatively charged particles are arranged in a layer shape, may be formed at an interface between plating liquid 35 and the Pd plating layer 83. In this case, it is important to maintain the layer for transferring the electrons stably in order to transfer the electrons promptly.

In the comparative example, the state of the plating liquid 35 existing on the substrate 2 is unstable at the central portion of the substrate 2 or in the vicinity of the central portion of the substrate 2. In such a case, the layer for transferring the electrons may also become unstable, so that a transfer speed of the electrons may be decreased or the electrons may not be transferred. As a result, in the comparative example, a thickness of the Co plating layer 84 formed on the central portion of the substrate 2 or in the vicinity of the central portion of the substrate 2 may become smaller than a thickness of the Co plating layer 84 formed on the other region of the substrate 2, or the Co plating layer 84 may not be formed on the central portion of the substrate 2 at all.

In contrast, in accordance with the example embodiment, by discharging the plating liquid 35 toward the central portion of the substrate 2 through the inclined discharge opening 46a, as described above, an impact applied to the substrate 2 by the plating liquid 35 reaching the central portion of the substrate 2 can be reduced. Thus, the layer for transferring the electrons can be stably maintained, and the electrons can be promptly transferred between the plating liquid 35 and the Pd coating layer 83. Therefore, the thickness of the Co plating layer 84 formed on the central portion of the substrate 2 can be suppressed from being smaller than the thickness of the Co plating layer 84 formed on the other region of the substrate. Furthermore, by using the inclined discharge opening 46a, it is possible to weaken the impact applied to the substrate 2 by the plating liquid 35 without reducing a discharge flow rate of the plating liquid 35.

(Modification Example of Plating Liquid Supplying Device)

In the present example embodiment, the plating liquid supplying device 30 includes the supply tank 31 configured to store therein the plating liquid 35; the tank heating unit 50 configured to heat the plating liquid 35 within the supply tank 31 to the storage temperature; the first supply line 33A configured to supply the plating liquid 35 of the supply tank 31 to the first nozzle 40; the first heating unit 60A provide at the first supply line 33A and configured to heat the plating liquid 35, which is supplied to the first nozzle 40, to the first discharge temperature; the second supply line 33B configured to supply the plating liquid 35 of the supply tank 31 to the second nozzle 45; and the second heating unit 60B provided at the second supply line 33B and configured to heat the plating liquid 35, which is supplied to the second nozzle 45, to the second discharge temperature. However, the example embodiment may not be limited thereto, and the plating liquid supplying device 30 may have various configurations as long as the temperature of the plating liquid 35 supplied to the first nozzle 40 is set to be higher than the temperature of the plating liquid 35 supplied to the second nozzle 45.

By way of example, in the plating liquid supplying device 30, the tank heating unit 50 configured to heat the plating liquid 35 within the supply tank 31 to the storage temperature may be omitted. In such a configuration, the plating liquid 35 of a room temperature reaches the first heating unit 60A and the second heating unit 60B. Then, the plating liquid 35 is heated to the first discharge temperature by the first heating unit 60A and, also, heated to the second discharge temperature by the second heating unit 60B.

Further, in the plating liquid supplying device 30, the second heating unit 60B may be omitted. In such a configuration, the storage temperature controlled by the tank heating unit 50 is set to be higher than the plating temperature. That is, the plating liquid 35 within the supply tank 31 is heated to a temperature higher than the plating temperature by the tank heating unit 50. With this configuration, the temperature of the plating liquid 35 discharged from the second nozzle 45 can be set to a preset temperature equal to or higher than the plating temperature. Further, by using the first heating unit 60A, the temperature of the plating liquid 35 supplied to the first nozzle 40 can be set to be higher than the temperature of the plating liquid 35 supplied to the second nozzle 45.

Figure 11:
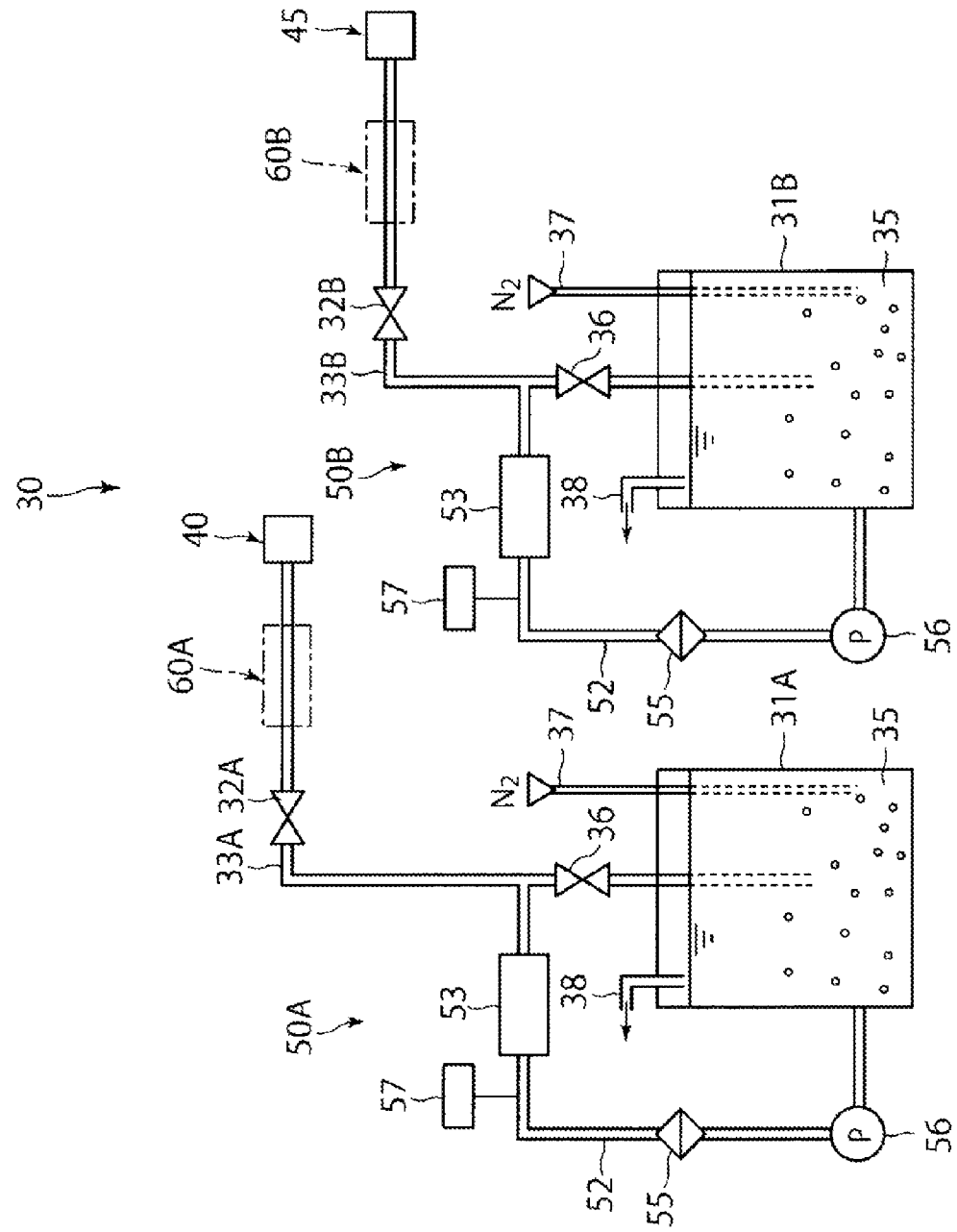
FIG. 11 is a diagram illustrating a modification example of the plating liquid supplying device.

Referring to FIG. 11, the plating liquid supplying device 30 may include a first supply tank 31A and a second supply tank 31B configured to store therein the plating liquid 35; the first supply line 33A configured to supply the plating liquid 35 of the first supply tank 31A to the first nozzle 40; the second supply line 33B configured to supply the plating liquid 35 of the second supply tank 31B to the second nozzle 45; a first tank heating unit 50A configured to heat the plating liquid 35 within the first supply tank 31A to a first storage temperature; and a second tank heating unit 50B configured to heat the plating liquid 35 within the second supply tank 31B to a second storage temperature. Here, except that target temperatures are different, the other configuration of the first tank heating unit 50A and the second tank heating unit 50B is the same as that of the above-described tank heating unit 50 illustrated in FIG. 4. Parts of the first tank heating unit 50A and the second tank heating unit 50B shown in FIG. 11 which are the same as those of the tank heating unit 50 shown in FIG. 4 will be assigned same reference numerals, and detailed description thereof will be omitted.

In the modification example shown in FIG. 11, the first tank heating unit 50A and the second tank heating unit 50B are controlled by the controller 160 such that the first storage temperature is higher than the second storage temperature. Further, the first storage temperature and the second storage temperature are set to be higher than the aforementioned plating temperature. Accordingly, the temperature of the plating liquid 35 supplied to the first nozzle 40 and the second nozzle 45 can be controlled to be higher than the plating temperature, and the temperature of the plating liquid 35 supplied to the first nozzle 40 can be set to be higher than the temperature of the plating liquid 35 supplied to the second nozzle 45.

Furthermore, as indicated by a dashed dotted line in the modification example of FIG. 11, the plating liquid supplying device 30 may further include the first heating unit 60A and the second heating unit 60B. In this configuration, the plating liquid 35 is heated through two stages by the tank heating units 50A and 50B and the heating units 60A and 60B, respectively, as in the case shown in FIG. 4. Accordingly, the temperature of the plating liquid 35 stored in the first supply tank 31A and the second supply tank 31B can be set to be lower than the plating temperature. Thus, it is possible to suppress deactivation of a reducing agent in the plating liquid 35 or evaporation of a component of the plating liquid 35 within the supply tanks 31A and 31B. Therefore, a decrease of a lifetime of the plating liquid 35 can be suppressed.

(Modification Example of Second Nozzle)

Figure 12:
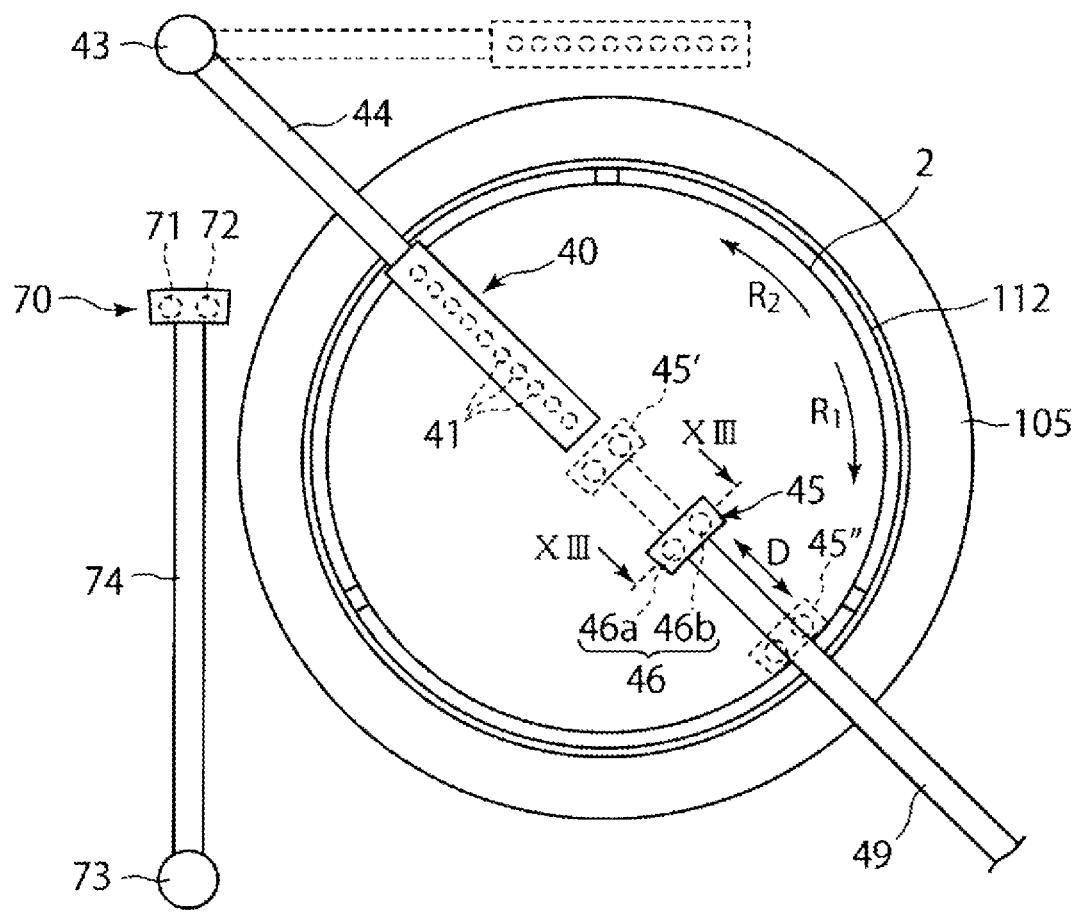
FIG. 12 is a plane view illustrating a modification example of the second nozzle.
Figure 13:
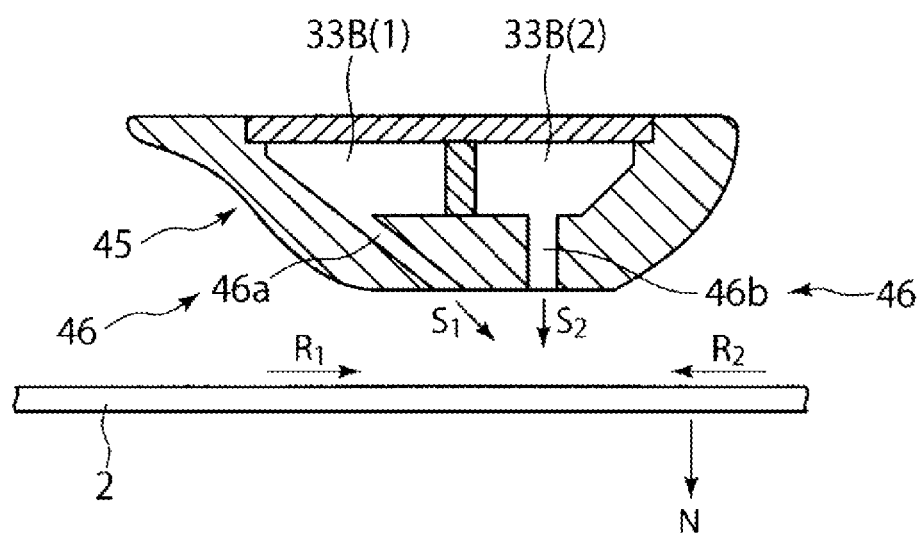
FIG. 13 is a cross sectional view of the second nozzle taken along a line XIII-XIII of FIG. 12.

Further, in the present example embodiment, the discharge opening 46 of the second nozzle 45 has the inclined discharge opening 46a through which the plating liquid 35 is discharged toward the substrate 2 along the inclined direction $S_1$ inclined with respect to the normal direction N of the substrate 2. However, the example embodiment may not be limited thereto, and the discharge opening 46 of the second nozzle 45 may further include a vertical discharge opening 46b configured to discharge the plating liquid 35 toward the substrate 2 along the normal direction N of the substrate 2. FIG. 12 is a plane view illustrating the second nozzle 45 having the discharge opening 46 that further includes the vertical discharge opening 46b. FIG. 13 is a cross sectional view of the second nozzle 45 taken along a line XIII-XIII of FIG. 12.

As depicted in FIG. 13, the vertical discharge opening 46b is formed to discharge the plating liquid 35 along a direction $S_2$ parallel to the normal direction N of the substrate 2. In the example shown in FIG. 13, a second supply line 33B(1) for the inclined discharge opening is connected to the inclined discharge opening 46a, and a second supply line 33B(2) for the vertical discharge opening is connected to the vertical discharge opening 46b. Further, though not shown, provided between the second supply lines 33B(1) and 33B(2) and the second supply line 33B is a closing member configured to selectively supply the plating liquid 35 within the second supply line 33B into either one of the second supply line 33B(1) for the inclined discharge opening and the second supply line 33B(2) for the vertical discharge opening. The closing member is controlled by the controller 160. With this configuration, by controlling the closing member through the controller 160, a supply of the plating liquid 35 into either one of the inclined discharge opening 46a and the vertical discharge opening 46b can be stopped. That is, the closing member is capable of closing either one of the inclined discharge opening 46a and the vertical discharge opening 46b under the control of the controller 160.

In the configuration where the discharge opening 46 of the second nozzle 45 further includes the vertical discharge opening 46b, the following effects may be achieved by selectively using either one of the inclined discharge opening 46a and the vertical discharge opening 46b depending on the situation. By way of example, in the above-described liquid displacement process (block S305), the plating liquid 35 is discharged toward the substrate 2 through the vertical discharge opening 46b of the second nozzle 45. Meanwhile, in the above-described incubation process (block S306) and the plating film growing process (block S307), the plating liquid 35 is discharged toward the substrate 2 through the inclined discharge opening 46a of the second nozzle 45. Accordingly, in the liquid displacement process (block S305), an impact applied to the substrate 2 by the plating liquid 35 reaching the substrate 2 can be increased, so that displacement of the rinse liquid on the substrate 2 by the plating liquid 35 can be accelerated. Further, in the incubation process (block S306) and the plating film growing process (block S307), an impact applied to the substrate 2 by the plating liquid 35 reaching the substrate 2 can be decreased, as in the above-described example embodiment. Accordingly, it is possible to suppress the formation of the initial Co plating layer 84 and the growth of the Co plating layer 84 from being deteriorated by the impact.

(Modification Example of First Nozzle)

Figure 14:
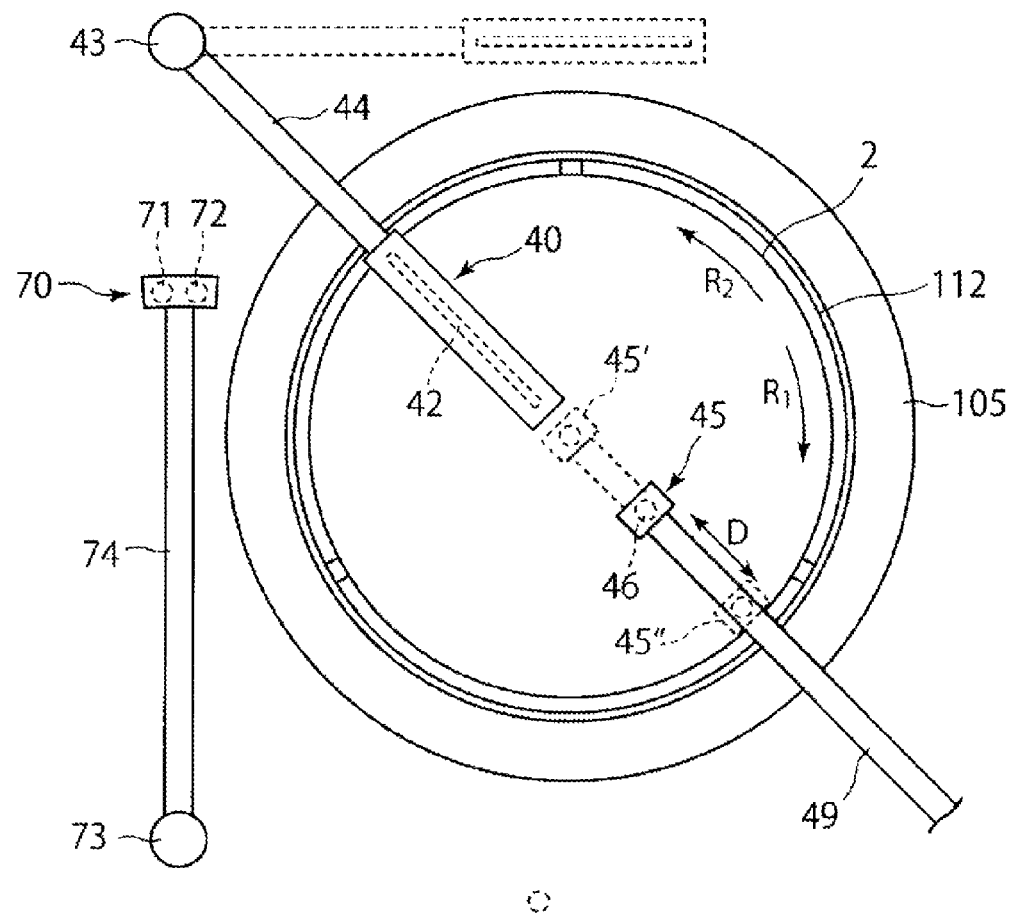
FIG. 14 is a plane view illustrating a modification example of a first nozzle.

In addition, in the present example embodiment, the first nozzle 40 includes the multiple number of discharge openings 41 arranged in the radial direction of the substrate 2. However, the configuration of the first nozzle 40 may not be particularly limited as long as the first nozzle 40 is capable of directly supplying the plating liquid 35 onto a region on the substrate 2 within a certain range in the radial direction of the substrate 2. By way of example, as illustrated in FIG. 14, the first nozzle 40 may have a slit-shaped discharge opening 42 extended in the radial direction of the substrate 2. Alternatively, though not shown, the first nozzle 40 may be formed of a multiple number of separate nozzles arranged in the radial direction of the substrate 2.

Further, as in the case of the inclined discharge opening 46a of the second nozzle 45, the discharge openings 41 or the discharge opening 42 of the first nozzle 40 may be formed to discharge the plating liquid 35 toward the substrate 2 along a direction inclined with respect to the normal direction N of the substrate 2. With this configuration, it is possible to reduce an impact applied to the substrate 2 when the plating liquid 35 discharged from the first nozzle 40 reaches the substrate 2. Accordingly, in the incubation process (block S306) and the plating film growing process (block S307), the layer for transferring electrons between the plating liquid 35 and the Pd plating layer 83 can be maintained more stably.

(First Modification Example of Control Method)

In the present example embodiment, the second nozzle 45 discharges the plating liquid 35 toward the substrate 2 while the discharge opening 46 of the second nozzle 45 is located at a position closer to the central portion of the substrate 2 than each discharge opening 41 of the first nozzle 40. However, the example embodiment may not be limited thereto, and the controller 160 may control the second nozzle 45 and the arm 49 such that the second nozzle 45 discharges the plating liquid 35 toward the substrate 2 while the second nozzle 45 is being moved from a central position to a peripheral position.

Figure 15A:
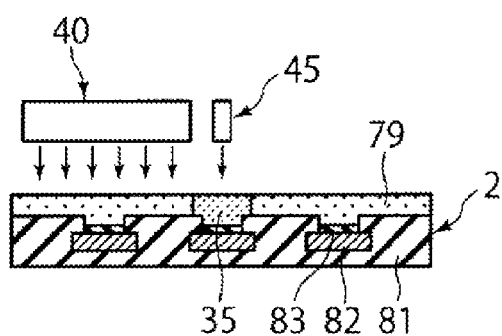
FIG. 15A and FIG. 15B are diagrams illustrating a first modification example of a control method for the second nozzle.
Figure 15B:
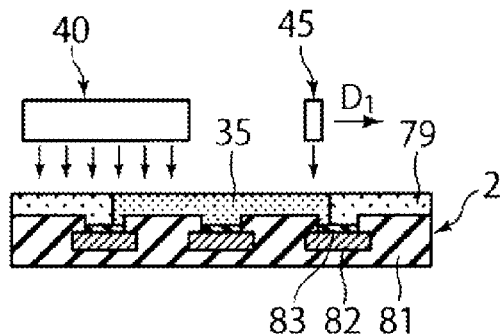

FIG. 15A and FIG. 15B are diagrams illustrating an example where, in the aforementioned liquid displacement process (block S305), the second nozzle 45 discharges the plating liquid 35 toward the substrate 2 while the second nozzle 45 is being moved from the central position to the peripheral position. In FIG. 15B, a direction oriented from the central position toward the peripheral position is indicated by an arrow $D_1$. In this case, as shown in FIG. 15A, the second nozzle 45 discharges, at the central position, the plating liquid 35 toward the central portion of the substrate 2. Then, as shown in FIG. 15B, while the second nozzle 45 is being moved from the central position to the peripheral position, the second nozzle 45 discharges the plating liquid 35 toward the substrate 2. Through this process, as shown in FIG. 15A and FIG. 15B, the rinse liquid 79 on the substrate 2 is displaced by the plating liquid 35 in sequence along a direction from the central portion of the substrate 2 toward the peripheral portion thereof.

If the second nozzle 45 discharges the plating liquid 35 toward the substrate 2 while it is being moved from the central position to the peripheral position, a velocity component of the discharged plating liquid 35 includes a velocity component in a horizontal direction from the central portion of the substrate 2 toward the peripheral portion thereof as a velocity component corresponding to a moving speed of the second nozzle 45. Accordingly, a force by which the plating liquid 35 pushes the rinse liquid 79 toward the peripheral portion of the substrate 2 can be increased, so that the rinse liquid 79 on the substrate 2 can be displaced by the plating liquid 35 more efficiently.

(Second Modification Example of Control Method)

In the above-described first modification example of control method, the second nozzle 45 and the arm 49 are controlled by the controller 160 such that the second nozzle 45 discharges the plating liquid 35 toward the substrate 2 while the second nozzle 45 is being moved from the central position to the peripheral position. However, the example embodiment may not be limited thereto, and the second nozzle 45 and the arm 49 may be controlled by the controller 160 such that the second nozzle 45 discharges the plating liquid 35 toward the substrate 2 while the second nozzle 45 is being moved from the peripheral position to the central position.

Figure 16A:
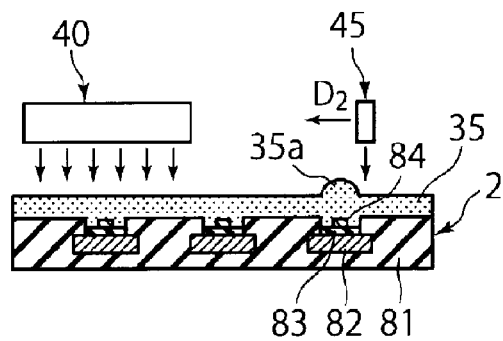
FIG. 16A and FIG. 16B are diagrams illustrating a second modification example of the control method for the second nozzle.
Figure 16B:
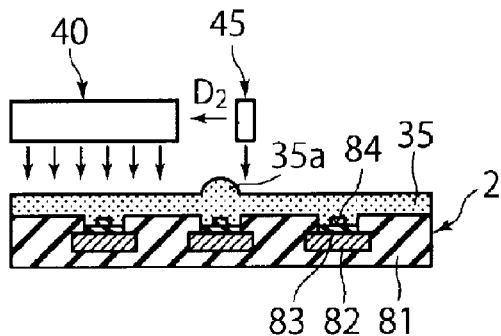

FIG. 16A and FIG. 16B are diagrams illustrating an example where, in the aforementioned incubation process (block S306), the second nozzle 45 discharges the plating liquid 35 toward the substrate 2 while the second nozzle 45 is being moved from the peripheral position to the central position. In FIG. 16A and FIG. 16B, a direction oriented from the peripheral position toward the central position is indicated by an arrow $D_2$.

If the second nozzle 45 discharges the plating liquid 35 toward the substrate 2 while the second nozzle 45 is being moved from the peripheral position to the central position, the velocity component of the discharged plating liquid 35 includes a velocity component in a horizontal direction from the peripheral portion of the substrate 2 toward the central portion thereof as a velocity component corresponding to the moving speed of the second nozzle 45. Meanwhile, the substrate 2 is being rotated by the substrate holding/rotating device 110. Accordingly, the plating liquid 35 that already exists on the substrate 2 may be moved from the central portion of the substrate 2 toward the peripheral portion thereof by a centrifugal force. That is, the horizontal velocity component of the plating liquid 35 discharged from the second nozzle 45 toward the substrate 2 and a horizontal velocity component of the plating liquid 35 already existing on the substrate 2 are reverse to each other. In this case, as illustrated in FIG. 16A and FIG. 16B, the plating liquid 35 discharged from the second nozzle 45 and the plating liquid 35 already existing on the substrate 2 may collide with each other, and, thus, the flow of the plating liquid 35 may be stagnated. As a result, a liquid accumulation portion 35a of the plating liquid 35 may be formed on the substrate 2. In accordance with the present modification example, by forming the liquid accumulation portion 35a, the layer for transferring electrons can be more stably maintained, and the electrons can be transferred between the plating liquid 35 and the Pd plating layer 83 more promptly. Therefore, the formation of the initial Co plating layer 84 on the Pd plating layer 83 can be accelerated.

In accordance with the present modification example, in the incubation process (block S306), the second nozzle 45 is controlled to discharge the plating liquid 35 toward the substrate 2 while the second nozzle 45 is being moved from the peripheral position to the central position. However, without being limited to the incubation process, the second nozzle 45 and the arm 49 may be controlled by the controller 160 in the above-described plating film growing process (block S307) as well such that the second nozzle 45 discharges the plating liquid 35 toward the substrate 2 while the second nozzle 45 is being moved from the peripheral position to the central position. Through this control, the growth of the Co plating layer 84 can be accelerated.

Desirably, the controller 160 may control the second nozzle 45 and the arm 49 such that in the liquid displacement process (block S305), the second nozzle 45 discharges the plating liquid 35 toward the substrate 2 while the second nozzle is being moved from the central position to the peripheral position and, in the incubation process (block S306), the second nozzle 45 discharges the plating liquid 35 toward the substrate 2 while the second nozzle is being moved from the peripheral position to the central position. Through this control, it is possible to perform both the liquid displacement process (block S305) and the incubation process (block S306) efficiently.

(Third Modification Example of Control Method)

Further, in the present example embodiment, the substrate 2 is described to be rotated in the first rotational direction $R_1$ by the substrate holding/rotating device 110. However, the example embodiment may not be limited thereto, and the substrate 2 may be rotated in the second rotational direction $R_2$ depending on the situation.

By way of example, in the liquid displacement process (block S305), the controller 160 may control the substrate holding/rotating device 110 and the second nozzle 45 such that the plating liquid 35 is discharged toward the substrate 2 from the inclined discharge opening 46a of the second nozzle 45 while the substrate 2 is being rotated in the second rotational direction $R_2$. Here, the inclined discharge opening 46a corresponds to the first rotational direction $R_1$ as described above, and the second rotational direction $R_2$ is reverse to the first rotational direction $R_1$. Accordingly, when rotating the substrate 2 in the second rotational direction $R_2$, there is generated a great difference between a moving speed of the substrate 2 in the horizontal direction and a moving speed of the plating liquid 35 in the horizontal direction at a region of the substrate 2 with which the plating liquid 35 has collided. Thus, by discharging the plating liquid 35 toward the substrate 2 from the inclined discharge opening 46a while the substrate 2 is being rotated in the second rotational direction $R_2$, it is possible to increase an impact applied to the substrate 2 by the plating liquid 35 having collided with the substrate 2. Therefore, a force by which the plating liquid 35 pushes the rinse liquid 79 can be increased, so that it is possible to displace the rinse liquid 79 on the substrate 2 by the plating liquid 35 more efficiently.

Desirably, the controller 160 may control the substrate holding/rotating device 110 and the second nozzle 45 such that in the liquid displacement process (block S305), the second nozzle 45 discharges the plating liquid 35 toward the substrate 2 while the substrate 2 is being rotated in the second rotational direction $R_2$ and, in the incubation process (block S306), the second nozzle 45 discharges the plating liquid 35 toward the substrate 2 while the substrate 2 is being rotated in the first rotational direction $R_1$. Through this control, an impact applied to the substrate 2 by the plating liquid 35 can be increased in the liquid displacement process (block S305) but can be decreased in the incubation process (block S306). Thus, it is possible to perform both the liquid displacement process (block S305) and the incubation process (block S306) efficiently.

(Fourth Modification Example of Control Method)

Further, in the present example embodiment, in all of the liquid displacement process (block S305), the incubation process (block S306) and the plating film growing process (block S307), the plating liquid 35 is discharged from both of the first nozzle 40 and the second nozzle 45 toward the substrate 2. However, the example embodiment may not be limited thereto, the first nozzle 40 and the second nozzle 45 may be selectively used in each process as long as at least the second nozzle 45 is used in the liquid displacement process (block S305) and at least the first nozzle 40 is used in the incubation process (block S306). By way of example, in the liquid displacement process (block S305), the plating liquid 35 may be discharged toward the substrate 2 by using only the second nozzle 45. Further, in the incubation process (block S306) and the plating film growing process (block S307), the plating liquid 35 may be discharged toward the substrate 2 by using only the first nozzle 40.

(Other Modification Examples)

In the present example embodiment and the modification examples, by using the inclined discharge opening 46a of the second nozzle 45, it is possible to decrease an impact applied to the substrate 2 by the plating liquid 35 discharged from the second nozzle 45 in the incubation process (block S306). However, a specific unit to decrease the impact applied to the substrate 2 by the plating liquid 35 discharged from the second nozzle 45 may not be particularly limited. By way of example, even if the discharge opening 46 of the second nozzle 45 has only the vertical discharge opening 46b, a discharge rate of the plating liquid 35, which is discharged from the second nozzle 45 toward the substrate 2 in the incubation process (block S306), in the normal direction N of the substrate 2 can be reduced by appropriately adjusting the second valve 32B of the plating liquid supplying device 30. Thus, it is possible to reduce the impact applied to the substrate 2 by the plating liquid 35 discharged from the second nozzle 45 in the incubation process (block S306). In such a case, desirably, the controller 160 controls the plating liquid supplying device 30 such that the discharge rate of the plating liquid 35, which is discharged from the second nozzle 45 toward the substrate 2 in the incubation process (block S306), in the normal direction N of the substrate 2 is smaller than a discharge rate of the plating liquid 35, which is discharged from the second nozzle 45 toward the substrate 2 in the liquid displacement process (block S305), in the normal direction N of the substrate 2. Through this control, both the liquid displacement process (block 5305) and the incubation process (block 5306) can be performed efficiently.

Further, the present example embodiment and the modification examples have been described for the case where the CoP plating liquid is used as the plating liquid 35 for the chemical reduction plating discharged toward the substrate 2 from the first nozzle 40 and the second nozzle 45. However, the plating liquid 35 may not be limited to the CoP plating liquid, and various other kinds of plating liquids 35 can be employed. By way of non-limiting example, various plating liquids 35 such as a CoWB plating liquid, a CoWP plating liquid, a CoB plating liquid or a NiP plating liquid may be used as the plating liquid 35 for the chemical reduction plating.

Figure 17:
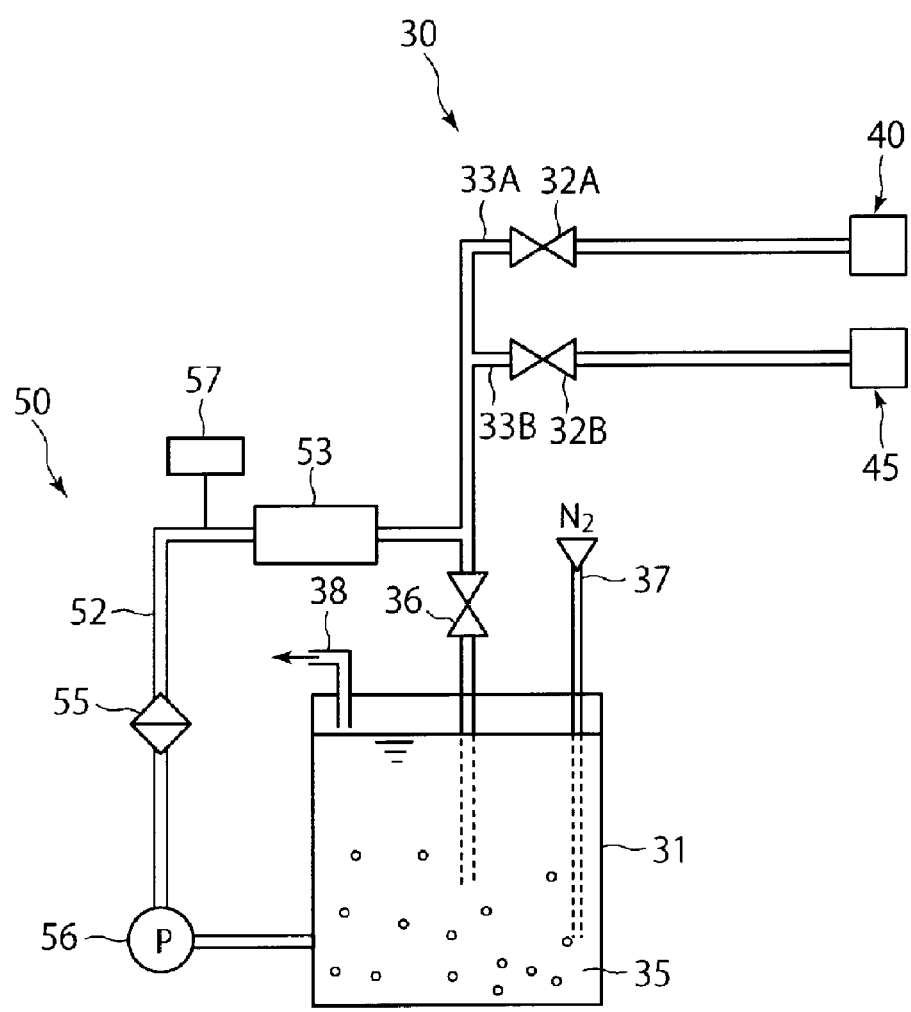
FIG. 17 is a diagram showing another modification example of the plating liquid supplying device.

Further, in the present example embodiment and the modification examples, the plating liquid supplying device 30 is configured to set the temperature of the plating liquid 35 supplied to the first nozzle 40 to be higher than the temperature of the plating liquid 35 supplied to the second nozzle 45. However, the example embodiment and the modification examples may not be limited thereto, and the temperature of the plating liquid 35 supplied to the first nozzle 40 and the temperature of the plating liquid 35 supplied to the second nozzle 45 may be set to be substantially same. By way of example, as illustrated in FIG. 17, the plating liquid 35 within the supply tank 31 may be heated to a temperature equal to or higher than the plating temperature by the tank heating unit 50, and this heated plating liquid 35 may be supplied to the first nozzle 40 and the second nozzle 45. Even in such a case, in accordance with the present example embodiment and the modification examples, it is possible to supply the plating liquid 35 directly from the first nozzle 40 onto a region of the substrate within a certain range in the radial direction of the substrate 2. Accordingly, it is possible to increase the temperature of the plating liquid 35 reaching the peripheral portion of the substrate 2 outer than the central portion of the substrate 2. Thus, it is possible to suppress a discrepancy between a reaction condition of the plating liquid 35 at the central portion of the substrate 2 and a reaction condition of the plating liquid 35 at the peripheral portion of the substrate 2.

(Experimental Examples)

An example of forming a Co plating layer on a central portion of a substrate 2 by using the second nozzle 45 of the above-described plating apparatus 20 will be explained.

A plating liquid is discharged toward the central portion of the substrate 2 by the second nozzle 45 while changing the type (inclined discharge opening 46a or vertical discharge opening 46b) of the used discharge opening 46, a discharge flow rate of the plating liquid 35 and a temperature of the plating liquid 35. Then, it is observed whether a Co plating layer having a sufficient thickness is formed on the central portion of the substrate 2. The result is provided in Table 1.

TABLE 1

| | | Temperature of Plating Liquid | | |
| --- | --- | --- | --- | --- |
| | | 73° C. | 79° C. | 84° C. |
| Discharge Conditions | Discharge Opening: Vertical Discharge Opening Discharge Flow Rate: 500 ml/min | — (Not Performed) | No Film Formed | No Film Formed |
| | Discharge Opening: Vertical Discharge Opening Discharge Flow Rate: 1000 ml/min | — (Not Performed) | No Film Formed | No Film Formed |
| | Discharge Opening: Inclined Discharge Opening Discharge Flow Rate: 1000 ml/min | No Film Formed | Film Formed | Film Formed |

As shown in Table 1, in the case of using the inclined discharge opening 46a, even when the discharge flow rate is set to be about 1000 ml/min, a Co plating layer is found to be formed on the central portion of the substrate 2. As can be seen from this result, by using the inclined discharge opening 46a, it is possible to form a Co plating layer on the central portion of the substrate 2 without decreasing a discharge flow rate of the plating liquid 35.

EXPLANATION OF CODES

1: Plating system
2: Substrate
20: Plating apparatus
21: Discharging device
30: Plating liquid supplying device
40: First nozzle
41: Discharge opening
45: Second nozzle
46: Discharge opening
46a: Inclined discharge opening
46b: Vertical discharge opening
110: Substrate holding/rotating device
160: Controller
161: Storage medium

What is claimed is:

1. A plating method of performing a plating process by supplying a plating liquid onto a substrate, the plating method comprising:
   loading the substrate on a substrate holding/rotating device;
   forming a first plating layer on the substrate by discharging a first plating liquid onto the substrate;
   supplying a pre-treatment liquid for performing a pre-treatment onto the substrate; and
   discharging, after the pre-treatment liquid is supplied onto the substrate, a second plating liquid toward the substrate through a discharging device,
   wherein the discharging device includes a first nozzle having a multiple number of discharge openings arranged in a radial direction of the substrate or having a discharge opening extended in the radial direction of the substrate; and a second nozzle having a discharge opening configured to be positioned closer to a central portion of the substrate than the discharge opening of the first nozzle, and
   the second plating liquid is discharged toward the substrate from at least one of the first nozzle and the second nozzle, and
   wherein the discharging of the second plating liquid toward the substrate through the discharging device includes a first process of discharging the second plating liquid toward the substrate to displace the pre-treatment liquid previously supplied onto the substrate by the second plating liquid; and a second process of discharging the second plating liquid toward the substrate after the first process to form a second plating layer on the first plating layer,
   in the first process, the second plating liquid is discharged toward the substrate at least through the second nozzle,
   in the second process, the second plating liquid is discharged toward the substrate through the first and second nozzles,
   the discharge opening of the second nozzle includes an inclined discharge opening configured to discharge the second plating liquid toward the substrate in an inclined direction that is inclined with respect to the normal direction of the substrate,
   in the second process, the substrate is being rotated in a first rotational direction corresponding to the inclined direction to decrease an impact applied to the substrate by the second plating liquid such that a thickness of the second plating layer on the central portion of the substrate is suppressed from being smaller than a thickness of the second plating layer on a peripheral portion of the substrate, and
   in the first process, the substrate is being rotated in a second rotational direction reverse to the first rotational direction to increase an impact applied to the substrate by the second plating liquid such that a force by which the second plating liquid pushes the pre-treatment liquid is increased.

2. The plating method of claim 1,
   wherein,
   a discharge rate of the second plating liquid discharged from the second nozzle toward the substrate in a normal direction of the substrate in the second process is set to be smaller than a discharge rate of the second plating liquid discharged from the second nozzle toward the substrate in the normal direction of the substrate in the first process.

3. The plating method of claim 1,
   wherein,
   the second nozzle is configured to be moved between a central position, where the discharge opening of the second nozzle is positioned closer to the central portion of the substrate than the discharge opening of the first nozzle, and a peripheral position outer than the central position,
   in the first process, the second nozzle discharges the second plating liquid toward the substrate while the second nozzle is being moved from the central position to the peripheral position, and
   in the second process, the second nozzle discharges the second plating liquid toward the substrate while the second nozzle is being moved from the peripheral position to the central position.

4. The plating method of claim 1,
   wherein a temperature of the second plating liquid supplied from the first nozzle toward the substrate is set to be higher than a temperature of the second plating liquid supplied from the second nozzle toward the substrate.

* * * * *